(12) United States Patent
DeLisio, Jr. et al.

(10) Patent No.: US 11,949,392 B1
(45) Date of Patent: Apr. 2, 2024

(54) BROADBAND POWER COMBINER/SPLITTER ARCHITECTURE WITH LOW LOSSES

(71) Applicant: Mission Microwave Technologies, LLC, Cypress, CA (US)

(72) Inventors: Michael P. DeLisio, Jr., Monrovia, CA (US); Donald Xiaodong Wu, Diamond Bar, CA (US); Nathaniel Schultz, Anaheim, CA (US); Blythe C. Deckman, Eastvale, CA (US)

(73) Assignee: Mission Microwave Technologies, LLC, Cypress, CA (US)

( * ) Notice: Subject to any disclaimer, the term of this patent is extended or adjusted under 35 U.S.C. 154(b) by 477 days.

(21) Appl. No.: 17/400,599

(22) Filed: Aug. 12, 2021

(51) Int. Cl.
*H03F 3/60* (2006.01)
*H01P 5/16* (2006.01)

(52) U.S. Cl.
CPC .............. *H03F 3/602* (2013.01); *H01P 5/16* (2013.01); *H03F 3/605* (2013.01)

(58) Field of Classification Search
CPC ............. H03F 3/602; H03F 3/605; H01P 5/16
See application file for complete search history.

(56) References Cited

U.S. PATENT DOCUMENTS

| | | | | |
|---|---|---|---|---|
| 8,698,577 | B2* | 4/2014 | Sherrer | H01P 5/12 333/127 |
| 9,065,163 | B1* | 6/2015 | Wu | H03F 3/211 |
| 9,287,605 | B2* | 3/2016 | Daughenbaugh, Jr. | H01Q 13/08 |
| 9,293,801 | B2* | 3/2016 | Courtney | H01P 5/12 |
| 2015/0229460 | A1* | 8/2015 | Mohamadi | B33Y 10/00 375/130 |
| 2021/0099143 | A1* | 4/2021 | Otake | H03F 3/195 |

\* cited by examiner

*Primary Examiner* — Patricia T Nguyen
(74) *Attorney, Agent, or Firm* — Christopher P. Maiorana, PC

(57) ABSTRACT

An apparatus comprising a first circuit and a circuit. The first circuit may be configured to receive an input signal, split the input signal into component signals and present the component signals to a plurality of amplifiers. The second circuit may be configured to receive amplified component signals from the amplifiers and combine the amplified component signals into an output signal. The circuits may each comprise an outer conductor, an inner conductor, a cavity and a plurality of blades. Each of the blades may be arranged evenly spaced along a surface within the cavity and extend along a length of the surface with a shape. The shape of the blades may have a probe and the shape may gradually meet the surface and may be configured to provide a low-loss transition for propagation of a microwave signal. The output signal may be an amplified version of said input signal.

20 Claims, 18 Drawing Sheets

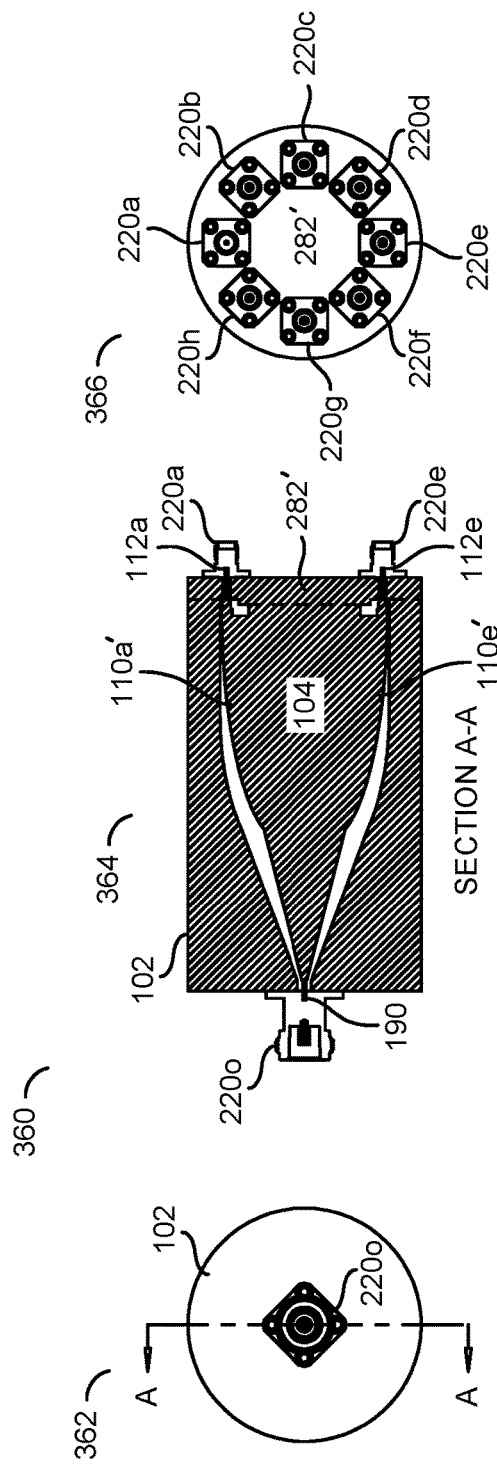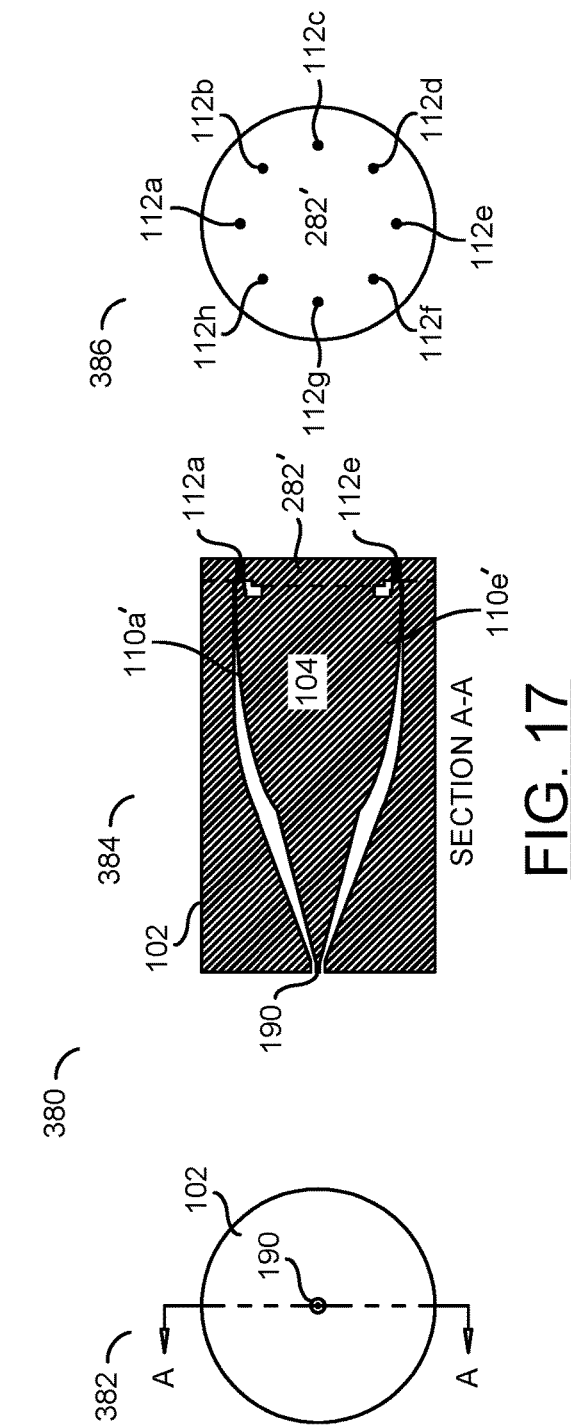

BROADBAND POWER COMBINER/SPLITTER ARCHITECTURE WITH LOW LOSSES

FIELD OF THE INVENTION

The invention relates to microwave signal transmission generally and, more particularly, to a method and/or apparatus for implementing a broadband power combiner/splitter architecture with low losses.

BACKGROUND

Microwave solid-state amplifiers continue to improve, enabling higher power applications. Generally, a power amplification circuit has a single input and provides an amplification of an input signal at a single output. However, some products demand more power than a single power amplification circuit is able to provide (i.e., a system requires 250 W, but only 25 W amplifiers are available). More power may be provided by combining amplification circuits. An input signal may be split into various components (i.e., using a splitter), each component may be amplified by one power amplification circuit and then the amplified components may be combined into an output (i.e., using a combiner). While combining multiple amplification circuits enables greater output power, there may be significant losses introduced into the system by both the splitter and the combiner.

Conventional methods of combining power amplification circuits may wire multiple power amplification circuits in parallel. However, connecting power amplification circuits in parallel may introduce reflective losses due to a lack of impedance matching. For example, one 50 ohm power amplification circuit will match a 50 ohm system. By combining ten power amplification circuits in parallel the impedance of power amplification circuits will be 5 ohms, which results in a mismatch to the 50 ohm system. Conventionally, resistance could be added to each power amplification circuit (i.e., add 450 ohms in series with each of the ten 50 ohm power amplification circuits) to retain the 50 ohm impedance matching. However, adding resistance results in a high loss system because of the power lost in the series resistors.

In addition to higher output powers, the operating bandwidth requirements for amplifiers continues to increase. The increased bandwidth requirements are particularly demanded in applications such as electronic warfare and instrumentation amplifiers. In electronic warfare and instrumentation amplifiers, the required operating bandwidth may span several octaves or decades.

It would be desirable to implement a broadband power combiner/splitter architecture with low losses.

SUMMARY

The invention concerns an apparatus comprising a first broadband power circuit and a second broadband power circuit. The first broadband power circuit may be configured to receive an input signal, split the input signal into a plurality of component signals and present each of the component signals to a respective one of a plurality of amplifiers. The second broadband power circuit may be configured to receive a plurality of amplified component signals from the plurality of amplifiers, combine the plurality of amplified component signals into an output signal and present the output signal. The first broadband power circuit and the second broadband power circuit each comprise an outer conductor, an inner conductor, a cavity and a plurality of blades. Each of the plurality of blades for both of the first broadband power circuit and the second broadband power circuit may be arranged evenly spaced along a surface within the cavity and extend along a length of the surface with a predetermined shape. The predetermined shape of each of the blades may have a probe at a first end and a second end of the predetermined shape may gradually meet the surface and may be configured to provide a low-loss transition for propagation of a microwave signal. The inner conductor may be within the cavity inside of the outer conductor for both of the first broadband power circuit and the second broadband power circuit. The output signal may be an amplified version of said input signal.

BRIEF DESCRIPTION OF THE FIGURES

Embodiments of the invention will be apparent from the following detailed description and the appended claims and drawings.

FIG. 16 is a diagram illustrating an example embodiment with coaxial connectors implemented extending from a back end.

FIG. 17 is a diagram illustrating an example embodiment with probes extending out from an inner conductor to a back end.

DETAILED DESCRIPTION OF THE EMBODIMENTS

Figure 1:
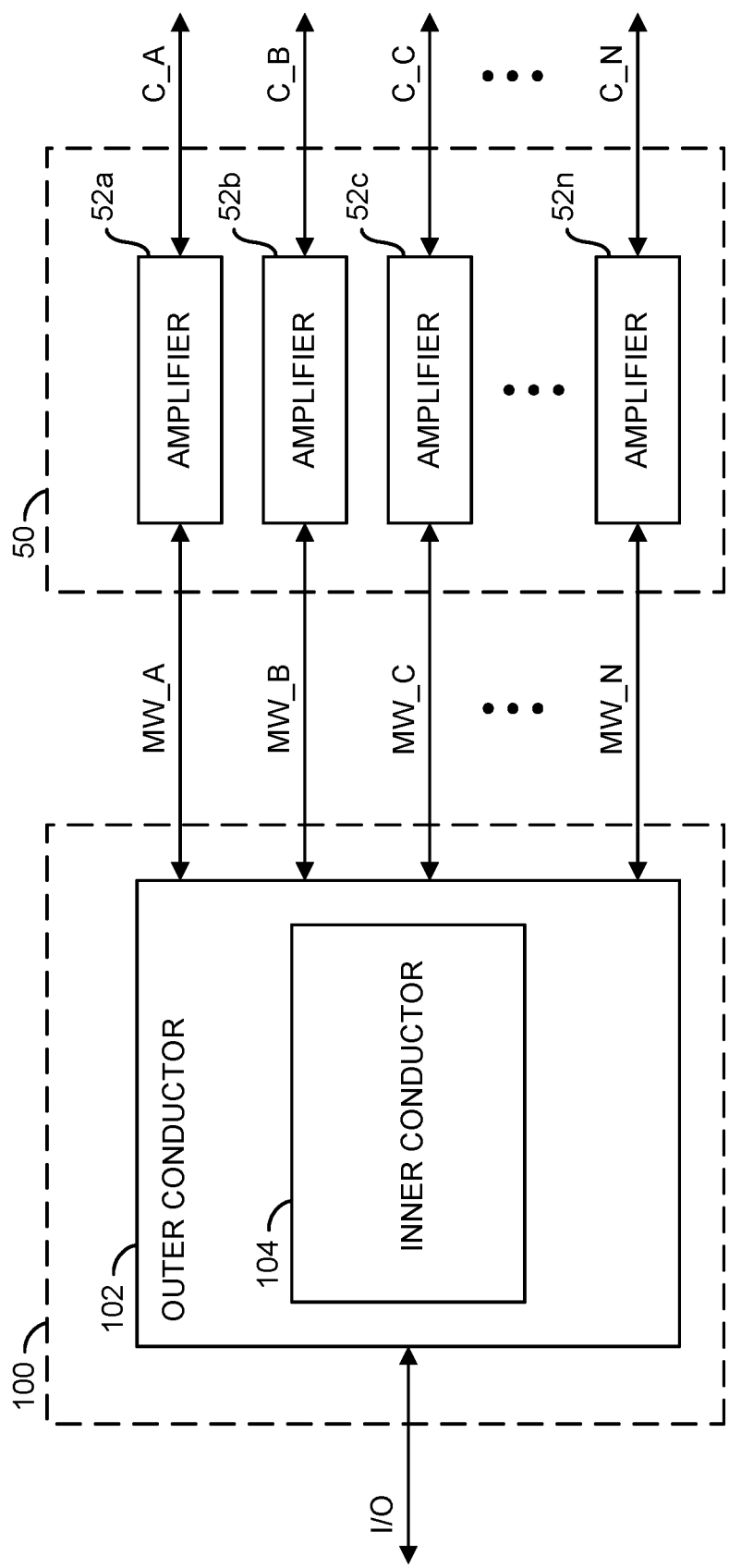
FIG. 1 is a diagram illustrating an example embodiment of the present invention.

Embodiments of the present invention include providing a broadband power combiner/splitter architecture with low losses that may (i) provide a high-power microwave signal, (ii) enable microwave signal amplification using multiple amplifiers, (iii) enable greater output power than a single amplifier may be capable of providing, (iv) provide a low-loss transition for a propagation of a microwave signal, (v) enable amplifier circuits to be easily accessible for replacement and cooling, (vi) provide an electromagnetically symmetrical waveguide, (vii) operate in a broad frequency range, spanning at least one octave (e.g., 4 GHz to 8 GHz or 2 GHz to 20 GHz), (viii) limit an amount of reflective losses and ohmic losses during signal propagation, (ix) be able to be used with many different amplifier circuits and/or (x) be implemented as one or more integrated circuits.

Embodiments of the present invention may be configured to implement a broadband power combiner and/or a broadband power splitter. Embodiments of the present invention may be configured to provide a low-loss transition for a propagation of a microwave signal. In one example, the low-loss transition may enable a propagation of the microwave signal from a single source to multiple outputs (e.g., a power splitter). In another example, the low-loss transition may enable a propagation of the microwave signal from multiple inputs to a single output (e.g., a power combiner). In some embodiments, one implementation of the present invention may be configured as a power splitter connected to another implementation of the present invention configured as a power combiner to form a single structure. For example, broadband amplifier circuits may be implemented between the power splitter implementation and the power combiner implementation.

Embodiments of the present invention may be configured to reduce ohmic losses and/or reflective losses in the transmission of the microwave signal. For example, the present invention may preserve an impedance of a system (e.g., enable impedance matching with another system). Ohmic losses may be reduced by avoiding the use of resistive and/or otherwise lossy elements. Reflective losses may be reduced by providing an impedance transformation. The ohmic losses and/or the reflective losses may be avoided while operating as a power splitter and/or while operating as a power combiner.

Embodiments of the present invention may be configured to split an input signal by fanning out multiple components of an input signal using a waveguide. An electromagnetically symmetric architecture may be implemented. For example, the input signal may be split equally among multiple conducting portions of the waveguide. The equal splitting of the input signal may provide component signals each having the same phase and same amplitude. Each equally split component of the input signal may be amplified individually. Similarly, the present invention may provide a combined (and amplified) output signal in response to the split components that have the same amplitude and phase. The individually amplified signals may be combined to provide a single amplified output (e.g., without introducing waste due to resistive elements) while preserving the impedance (e.g., to maintain an impedance match with a connected system).

A number of amplifiers may be connected to the embodiment of the present invention. The amplifiers may be arranged outside of the present invention. In one example, the amplifiers may be arranged around a circumference of the outside of the present invention. In another example, the amplifiers may be arranged in between two implementations of the present invention. Arranging the amplifiers outside of the present invention may provide easy physical access to the amplifier circuits. For example, a damaged amplifier circuit may be replaced without opening the present invention. In another example, forced air may be passed along the outside of the present invention to provide cooling (e.g., heat dissipation) for the amplifier circuits. The present invention may be device agnostic. For example, amplifier circuits may be replaced with different versions of amplifier circuits without negatively impacting system performance (e.g., amplifier agnostic).

Referring to FIG. 1, a diagram illustrating an example embodiment of the present invention is shown. A block (or circuit) 50 and/or a block (or circuit) 100 are shown. The block 50 may implement a combined amplifier circuit. The block 100 may implement a broadband power circuit. In one example, the broadband power circuit 100 may be configured as a broadband power combiner. In another example, the broadband power circuit 100 may be configured as a broadband power splitter. The broadband power circuit 100 may be configured to interface with the combined amplifier circuit 50.

The broadband power circuit 100 may be configured to communicate a signal (e.g., I/O) and multiple signals (e.g., MW_A-MW_N). The signal I/O may be received from (or transmitted to) a coaxial cable. The multiple signals MW_A-MW_N may be communicated between the broadband power circuit 100 and the combined amplifier circuit 50. In embodiments with the broadband power circuit 100 implemented as a broadband power splitter, the circuit 100 may receive the signal I/O from the coaxial cable, generate the signals MW_A-MW_N in response to the signal I/O and present the signals MW_A-MW_N to the combined amplifier circuit 50. In embodiments with the broadband power circuit 100 implemented as a broadband power combiner, the circuit 100 may receive the signals MW_A-MW_N from the combined amplifier circuit 50, generate the signal I/O in response to the signals MW_A-MW_N and present the signal I/O to the coaxial cable.

The combined amplifier circuit 50 may be configured to communicate the signals MW_A-MW_N and multiple signals (e.g., C_A-C_N). The signals MW_A-MW_N may be received from (or transmitted to) the broadband power circuit 100. The signals C_A-C_N may be received from (or transmitted to) another implementation of the broadband power circuit 100. In embodiments with the broadband power circuit 100 implemented as a broadband power splitter, the combined amplifier 50 may receive the signals MW_A-MW_N from the circuit 100, generate the signals C_A-C_N in response to the signals MW_A-MW_N and communicate the signals C_A-C_N to an implementation of the broadband power circuit 100 implemented as a broadband power combiner. In embodiments, with the broadband power circuit 100 implemented as a broadband power combiner, the combined amplifier circuit 50 may receive the signals C_A-C_N from the circuit 100 implemented as a broadband power splitter, generate the signals MW_A-MW_N in response to the signals C_A-C_N and present the signals MW_A-MW_N to the broadband power combiner 100. The configuration of the combined amplifier circuit 50 connected to one embodiment of the broadband power circuit 100 implemented as a broadband power splitter and another embodiment of the broadband power circuit 100 implemented as a broadband power combiner may be described in association with FIG. 21 and FIG. 22.

The signal I/O may comprise an input signal or an output signal. The signals MW_A-MW_N may comprise component signals (e.g., as input signals to the combined amplifier circuit 50) or amplified component signals (e.g., as output signals of the combined amplifier circuit 50). The signals C_A-C_N may comprise component signals (e.g., as input signals to the combined amplifier circuit 50) or amplified component signals (e.g., as output signals of the combined amplifier circuit 50). In one example, the signal I/O may be an input signal that may be split by the broadband power circuit 100 into the component signals MW_A-MW_N, the component signals MW_A-MW_N may be amplified by the combined amplifier circuit 50 to generate the amplified component signals C_A-C_N. In another example, the signals C_A-C_N may comprise component signals that may be amplified by the combined amplifier circuit 50 to generate the amplified component signals MW_A-MW_N, the amplified component signals MW_A-MW_N may be combined by the broadband power circuit 100 to generate the output signal I/O. The component signals MW_A-MW_N and/or the component signals C_A-C_N may be implemented having various octaves of bandwidth. In one example, the octaves of bandwidth may comprise a frequency range from approximately 2 GHz to 20 GHz. The frequency range of the signal I/O, the component signals MW_A-MW_N and/or the component signals C_A-C_N may be varied according to the design criteria of a particular implementation.

The multi-octave and/or decade bandwidth provided by the broadband power circuit 100 may enable the broadband circuit 100 to be implemented with military and/or commercial products. In an example, the multi-octave bandwidth provided by the broadband power circuit 100 may enable the broadband power circuit 100 to be implemented in high power jammers (e.g., for disabling radar in electronic warfare applications, communications, and/or triggers). In yet another example, the multi-octave bandwidth provided by the broadband power circuit 100 may enable the broadband power circuit 100 to be implemented in ultrawideband communications, radar and/or testing and measurement equipment (e.g., electromagnetic interference and/or electromagnetic compatibility testing).

The combined amplifier circuit 50 may comprise blocks (or circuits) 52a-52n. The circuits 52a-52n may each implement an amplifier circuit. The combined amplifier circuit 50 may comprise other components (not shown). The number, type and/or arrangement of the components of the combined amplifier circuit 50 may be varied according to the design criteria of a particular implementation.

Each of the amplifier circuits 52a-52n may be configured to receive a signal and generate an amplified version of the signal. In one example, each of the amplifier circuits 52a-52n may receive a respective one of the component signals MW_A-MW_N, perform an amplification on the respective one of the component signals MW_A-MW_N and generate a respective one of the amplified component signals C_A-C_N. In another example, each of the amplifier circuits 52a-52n may receive a respective one of the component signals C_A-C_N, perform an amplification on the respective one of the component signals C_A-C_N and generate a respective one of the amplified component signals MW_A-MW_N.

The broadband power circuit 100 may comprise a block (or circuit) 102 and/or a block (or circuit) 104. The circuit 102 may implement a conductor. The circuit 104 may implement a conductor. The broadband power circuit 100 may comprise other components (not shown). The number, type and/or arrangement of the components of the broadband power circuit 100 may be varied according to the design criteria of a particular implementation.

The broadband power circuit 100 may be implemented with the conductor 102 implemented as an outer conductor and the conductor 104 implemented as an inner conductor. The inner conductor 104 may be implemented within the outer conductor 102. In one example, the inner conductor 104 may be enclosed by the outer conductor 102 (e.g., entirely within). In another example, the inner conductor 104 may be inside the outer conductor 102 and the outer conductor 102 may have an open end (e.g., the inner conductor 104 may be visible inside the outer conductor 102). There may be space (e.g., a cavity) between the inner conductor 104 and the outer conductor 102 (e.g., the inner conductor 104 may fit inside the outer conductor 102 with enough room for there to be space between the outside of the inner conductor 104 and the inside of the outer conductor 102). Details of the arrangement of the outer conductor 102 and the inner conductor 104 may be described in association with FIGS. 4-20.

The inner conductor 104 may comprise a number of connectors. In an example, the connectors may comprise coaxial connectors. The connectors of the inner conductor 104 may enable the inner conductor to communicate the signal I/O and the signals MW_A-MW_N. The connectors of the inner conductor 104 may extend through the outer connector 102 (e.g., to provide external access). For example, a coaxial cable may be connected to the inner conductor 104 to communicate the signal I/O and a number of connectors may be implemented to enable the inner conductor 104 to communicate the component signals MW_A-MW_N to each of the amplifier circuits 52a-52n.

In some embodiments, the combined amplifier circuit 50 may be implemented on an outside of the outer conductor 102. In an example, the amplifier circuits 52a-52n may arranged around an outside of the outer conductor 102. Arranging the amplifier circuits 52a-52n around the outside of the outer conductor 102 may enable each of the amplifiers 52a-52n to be physically separated and spaced out to be connected to the broadband power circuit 100. Arranging the amplifier circuits 52a-52n around the outside of the outer conductor 102 may enable the each of the amplifier circuits 52a-52n to be physically accessible (e.g., replaced without opening the broadband power circuit 100). In one example, the broadband power circuit 100 may comprise a generally cylindrical shape and the amplifier circuits 52a-52n may be arranged around a circumference of the outer surface of the outer conductor 102 and each connected to a respective connector to the inner conductor 104.

Figure 2:
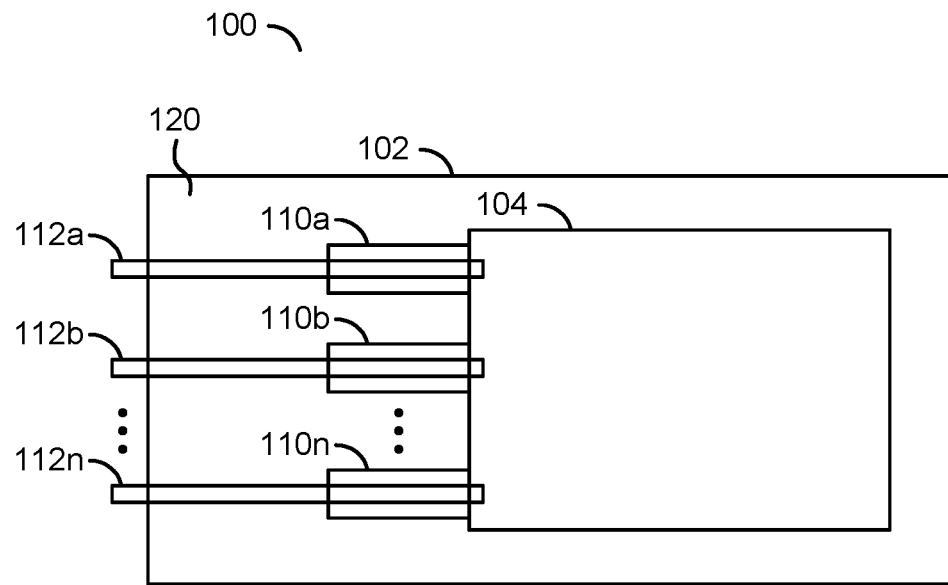
FIG. 2 is a block diagram illustrating an example embodiment of the present invention comprising blades attached to an inner conductor.

Referring to FIG. 2, a block diagram illustrating an example embodiment of the present invention comprising blades attached to an inner conductor is shown. An example embodiment of the broadband power circuit 100 is shown.

The broadband power circuit 100 is shown comprising the inner conductor 104 within the outer conductor 102.

A number of blocks (or circuits) 110a-110n and/or a number of blocks (or circuits) 112a-112n are shown. The blocks 110a-110n may each comprise a blade. The blocks 112a-112n may each comprise a probe. The broadband power circuit 100 may comprise other components (not shown). The number, type and/or arrangement of the components of the broadband power circuit 100 may be varied according to the design criteria of a particular implementation.

The blades (or fins) 110a-110n are shown within the outer conductor 102. The blades 110a-110n may be configured to extend along a length of the broadband power circuit 100. In the example shown, the blades 110a-110n are shown as a rectangular shape arranged as rows for illustrative purposes. In one example, the blades 110a-110n may be arranged around (e.g., evenly spaced) the broadband power circuit 100 (e.g., similar to the amplifiers 52a-52n). The blades 110a-110n may be implemented having a predetermined shape. In one example, the predetermined shape of the blades 110a-110n may be a curved shape. The blades 110a-110n may be configured to provide a low-loss transition for a microwave signal (e.g., one of the component signals MW_A-MW_N and/or the component signals C_A-C_N).

Each of the blades 110a-110n may comprise a respective one of the probes 112a-112n. The probes 112a-112n are shown extending through the blades 110a-110n. The probes 112a-112n may extend from the outer conductor 102. The probes 112a-112n may be configured to provide a connection between the inner conductor 104 and the outer conductor 102 through the blades 110a-110n.

The probes 112a-112n may be configured to connect the broadband power circuit 100 to one of the amplifiers 52a-52n. A connector may be attached to the probes 112a-112n. In one example, the probes 112a-112n may be connected to a coaxial connector. The coaxial connector may enable the probes 112a-112n to transmit the component signals MW_A-MW_N and/or the component signals C_A-C_N to an external device (e.g., the amplifiers 52a-52n).

A space 120 is shown. The space 120 may comprise a cavity within the broadband power circuit 100. The cavity 120 may comprise empty physical space between the inner conductor 104 and the outer conductor 102. The outer conductor 102 may be large enough to enable the inner conductor 104 to fit within and allow for the extra physical space of the cavity 120. The blades 110a-110n may extend through the cavity 120.

In the example shown, the blades 110a-110n are shown extending from the inner conductor 104. The blades 110a-110n may be connected to the inner conductor 104 and there may be a gap (e.g., part of the cavity 120) between the blades 110a-110n and the outer conductor 102. The probes 112a-112n may extend from the blades 110a-110n and out of the outer conductor 102. The blades 110a-110n may be arranged evenly spaced around the inner conductor 104. The blades 110a-110n may extend out from the inner conductor 104 and into the cavity 120.

The blades 110a-110n may comprise the predetermined shape that extends from the inner conductor 104. The predetermined shape of each of the blades 110a-110n may extend from the inner conductor 104 at one end with a respective one of the probes 112a-112n. The predetermined shape of each of the blades may gradually meet the inner conductor 104. For example, the one end of the blades 110a-110n may extend a greatest distance from the inner conductor 104 (e.g., be the tallest, have the greatest height, etc.) at the end that has the probes 112a-112n. The blades 110a-110n may gradually taper down towards the inner conductor 104 until the end without the probes 112a-112n meets the inner conductor 104 (e.g., gradually extend a shorter distance from the inner conductor 104 along a length of the blades 110a-110n).

Figure 3:
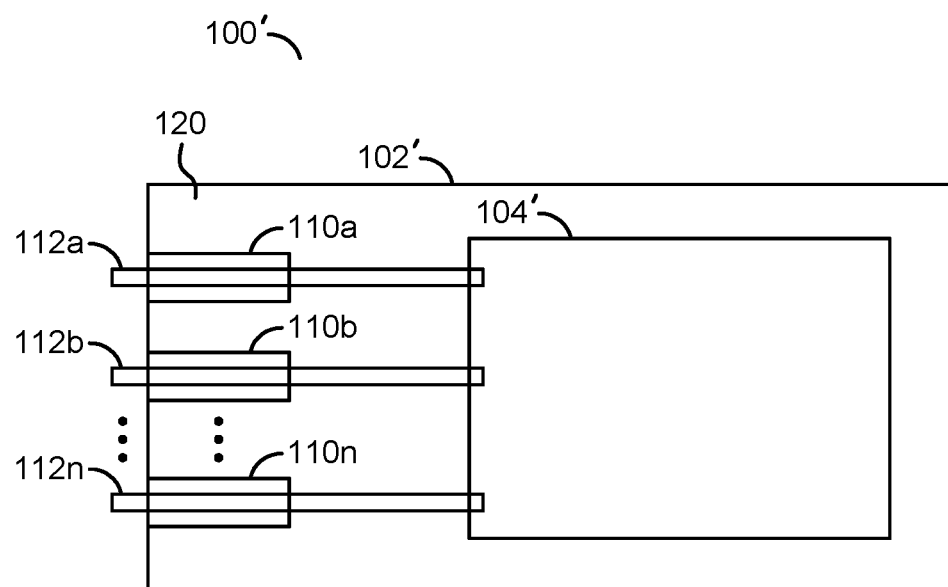
FIG. 3 is a block diagram illustrating an example embodiment of the present invention comprising blades attached to an outer conductor.

Referring to FIG. 3, a block diagram illustrating an example embodiment of the present invention comprising blades attached to an outer conductor is shown. An example embodiment of the broadband power circuit 100' is shown. The broadband power circuit 100' is shown comprising the inner conductor 104' within the outer conductor 102' and the cavity 120. The broadband power circuit 100' is shown comprising the blades 110a-110n and the probes 112a-112n. The outer conductor 102', the inner conductor 104', the blades 110a-110n, the probes 112a-112n and/or the cavity 120 may each perform the same general functionality as the outer conductor 102, the inner conductor 104, the blades 110a-110n, the probes 112a-112n and/or the cavity 120 as described in the broadband power circuit 100 shown in association with FIG. 2.

In the broadband power circuit 100', the blades 110a-110n are shown extending from the outer conductor 102. The blades 110a-110n may be connected to the outer conductor 102 and there may be a gap (e.g., part of the cavity 120) between the blades 110a-110n and the inner conductor 104. The probes 112a-112n may extend from the outer conductor 102, through the blades 110a-110n and through the cavity 120 to the inner conductor 104. The blades 110a-110n may be arranged evenly spaced around the outer conductor 102 (e.g., around the inner surface of the outer conductor 102). The blades 110a-110n may extend in from the outer conductor 102 and into the cavity 120.

The blades 110a-110n may comprise the predetermined shape that extends from the inner (or inside) surface of the outer conductor 102. The predetermined shape of each of the blades 110a-110n may extend from the inner surface of the outer conductor 102 at one end with a respective one of the probes 112a-112n. The predetermined shape of each of the blades may gradually meet the inner surface of the outer conductor 102. For example, the one end of the blades 110a-110n may extend a greatest distance from the inner surface of the outer conductor 102 (e.g., be the tallest, have the greatest height, etc.) at the end that has the probes 112a-112n. The blades 110a-110n may gradually taper down towards the inner surface of the outer conductor 102 until the end without the probes 112a-112n meets the inner surface of the outer conductor 102 (e.g., gradually extend a shorter distance from the inner surface of the outer conductor 102 along a length of the blades 110a-110n).

Figure 4:
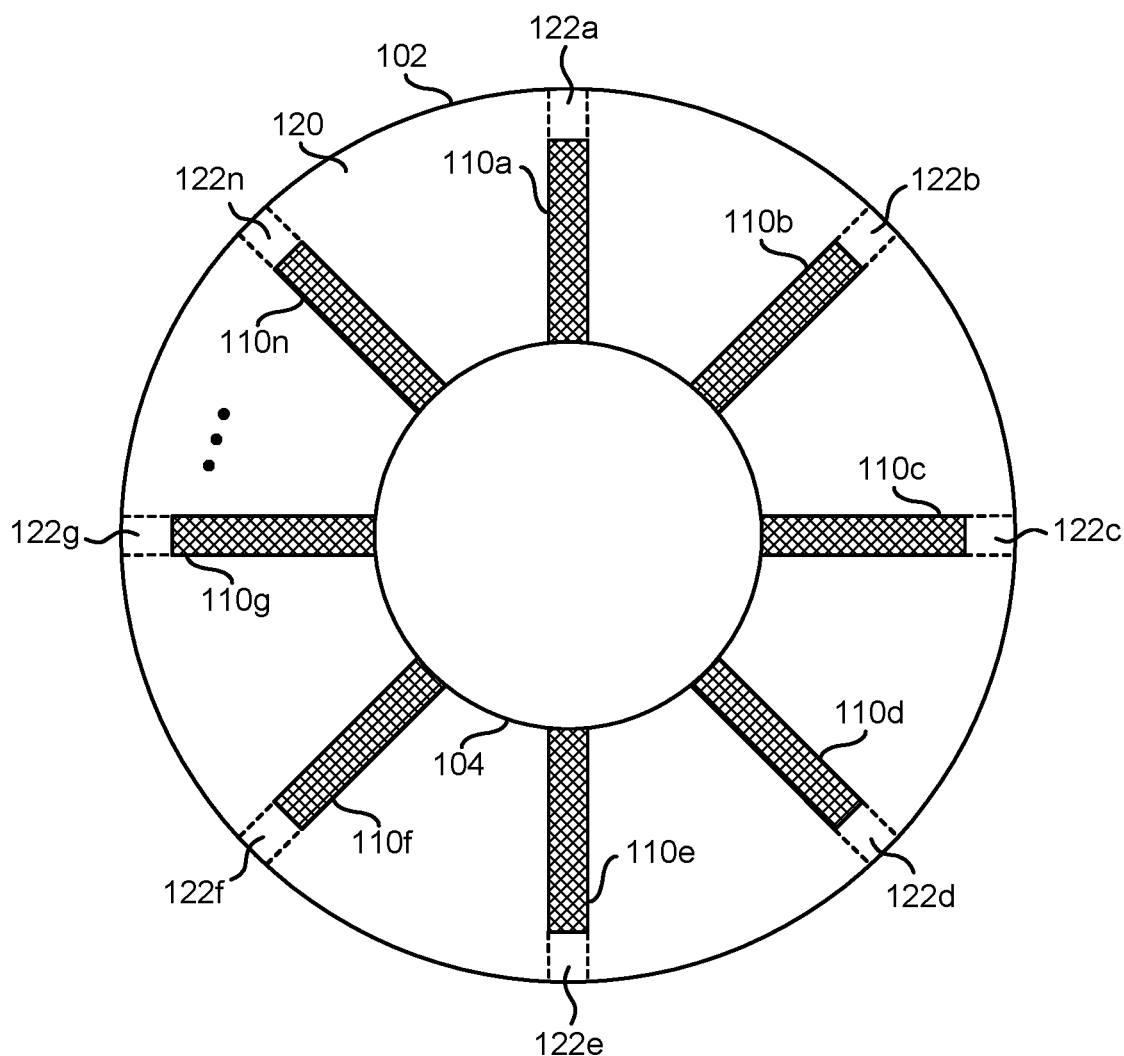
FIG. 4 is a diagram illustrating blades arranged evenly spaced around an inner conductor within an outer conductor.

Referring to FIG. 4, a diagram illustrating blades arranged evenly spaced around an inner conductor within an outer conductor is shown. A view of an example embodiment of the broadband power circuit 100 is shown (e.g., a front view or a rear view). The outer conductor 102, the inner conductor 104 and the blades 110a-110n are shown. For illustrative purposes, the probes 112a-112n are not shown.

The outer conductor 102 and the inner conductor 104 are each shown having a circular shape. In an example, the outer conductor 102 and the inner conductor 104 may each have a generally cylindrical shape (e.g., the cylindrical shape may be projected as a two-dimensional circle in the perspective shown). The inner conductor 104, the blades 110a-110n and the cavity 120 may be contained within the outer conductor 102.

In the example shown, the blades 110a-110n may be arranged around the inner conductor 104. The blades 110a-110n may extend from the inner conductor 104. The blades 110a-110n may be arranged evenly spaced around the circular shape of the inner conductor 104. In the example shown, the broadband power circuit 100 may comprise eight of the blades 110a-110n. In another example, the broadband power circuit 100 may comprise sixteen of the blades 110a-110n. The broadband power circuit 100 may comprise at least two of the blades 110a-110n. The number of the blades 110a-110n implemented by the broadband power circuit 100 may be varied according to the design criteria of a particular implementation.

The blades 110a-110n may extend from the inner conductor 104 and out towards an inside surface of the outer conductor 102. Gaps 122a-122n are shown between a respective one of the blades 110a-110n and the outer conductor 102. For example, the blades 110a-110n may each be a shorter length than a radius of the outer conductor 102. The gaps 122a-122n may be a space between the blades 110a-110n and the inner surface of the outer conductor 102. Generally, the probes 112a-112n (not shown) may extend from the blades 110a-110n, through the gaps 122a-122n and to the outer conductor 102.

The cavity 120 may comprise the negative space within the outer conductor 102. For example, the cavity 120 may be a portion of the volume of the outer conductor 102 that does not comprise the inner conductor 104, the blades 110a-110n and/or the probes 112a-112n. The cavity 120 may provide an air gap between the inner conductor 104 and the outer conductor 102. The gaps 122a-122n may be part of the cavity 120. A size of the gaps 122a-122n may be varied according to the design criteria of a particular implementation.

In the example shown, the blades 110a-110n may extend from the inner conductor 104 (e.g., similar to the embodiment of the broadband power circuit 100 shown in association with FIG. 2). In embodiments with the blades 110a-110n connected to the inside surface of the outer conductor 102 (e.g., as shown in association with FIG. 3), the blades 110a-110n may extend from the inner surface of the outer conductor 102 to the outer surface of the inner conductor 104. The circular arrangement and the spacing of the blades 110a-110n may be similar when connected to the inner surface of the outer conductor 102 as to the arrangement shown with the blades 110a-110n attached to the inner conductor 104. In embodiments with the blades 110a-110n attached to the outer conductor 102, the gaps 122a-122n may instead be located between the blades 110a-110n and the inner conductor 104. In embodiments with the blades 110a-110n attached to the outer conductor 102, the probes 112a-112n may go through the blades 110a-110n and into the inner conductor 104 (e.g., a longer connection for the probes 112a-112n compared to when the blades 110a-110n are connected to the inner conductor 104).

Figure 5:
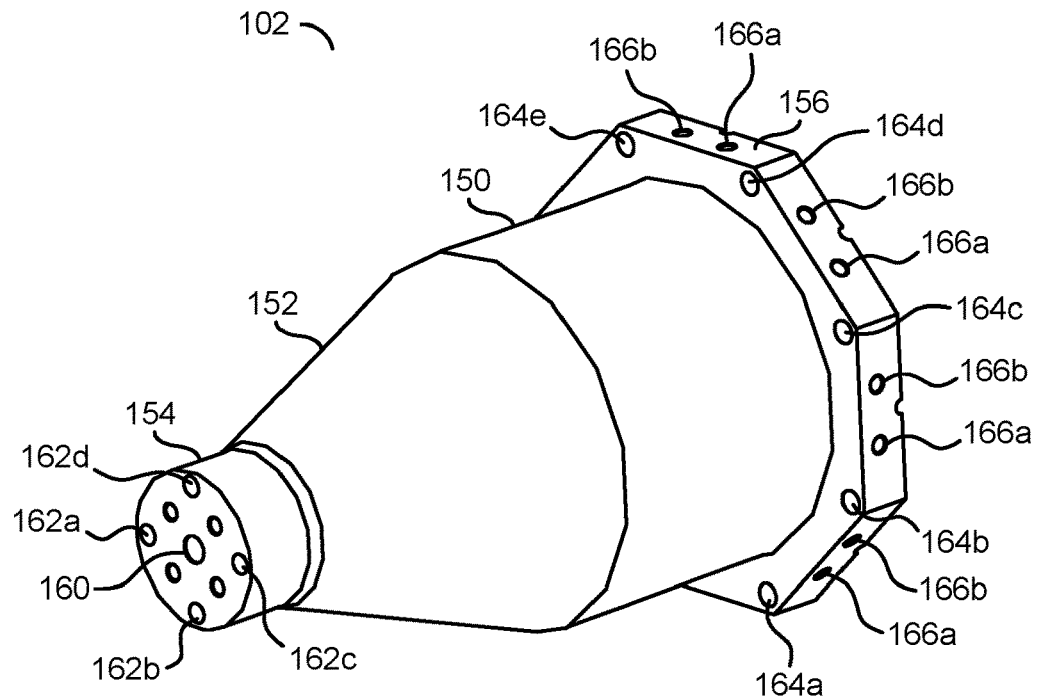
FIG. 5 is a diagram illustrating a view of an example implementation of an outer conductor.

Referring to FIG. 5, a diagram illustrating a view of an example implementation of an outer conductor is shown. The outer conductor 102 is shown. An outside of the outer conductor 102 is shown. The outer conductor 102 may comprise a first outer portion 150, a second outer portion 152, a front end 154 and a backplate 156. The outer conductor 102 is shown implemented as a general conical shape. The size and shape of the outer conductor 102 may be varied according to the design criteria of a particular implementation.

The first outer portion 150 may by a cylindrical portion (e.g., an outer surface cylinder). The outer surface cylinder 150 may be implemented between the backplate 156 and the second outer portion 152. The outer surface cylinder 150 may be hollow. For example, the cavity 120 may be within the outer surface cylinder 150.

The second outer portion 152 may be a tapered portion (e.g., an outer surface taper). The outer surface taper 152 may be implemented between the outer surface cylinder 150 and the front end 154. The outer surface taper 152 may comprise a conical shape. A base of the conical shape of the outer surface taper 152 may be connected to, and have the same radius as, the outer surface cylinder 150. The conical shape of the outer surface taper 152 may gradually narrow towards the front end 154. A radius of the tip of the outer surface taper 152 may meet with, and have the same radius as, the front end 154. The outer surface taper 152 may be hollow. For example, the cavity 120 may be within the outer surface taper 152.

The front end 154 may be attached to a tip of the outer surface taper 152. The front end 154 may comprise an opening 160 and/or openings 162a-162d. The front end 154 may be configured to enable a coaxial cable to be connected to the inner conductor 104. For example, the opening 160 may enable the signal I/O to be connected to the inner conductor 104. The openings 162a-162d may be mounting holes. The mounting holes 162a-162d may enable a connector to be attached to the outer conductor 102. The connector mounted to the mounting holes 162a-162d may enable a connection to a coaxial cable.

The backplate 156 may be attached to one end of the outer surface cylinder 150. The backplate 156 may be open at a back of the outer conductor 102 (not visible from the perspective shown). The backplate 156 may comprise through holes 164a-164e. The through holes 164a-164e may enable the backplate 156 of the outer conductor 102 to be connected to another plate (not shown). For example, the outer conductor 102 may be sealed by another plate (e.g., a solid plate) attached to the backplate 156.

The backplate 156 may comprise a number of mounting pairs 166a-166b. The mounting pairs 166a-166b may comprise two mounting holes. Each of the mounting pairs 166a-166b may be aligned with another set of the mounting pairs 166a-166b of the solid plate (not shown). The solid plate may have a similar configuration of the through holes 164a-164n and the mounting pairs 166a-166b. When the backplate 156 is covered by the solid plate, the mounting pairs 166a-166b of each of the plates may form a set of mounting holes. The mounting pairs 166a-166b may enable connectors to be attached to the backplate 156. The connectors may be attached to the probes 112a-112n. The connectors attached via the mounting pairs 166a-166b may enable the signals component signals MW_A-MW_N and/or the component signals C_A-C_N to be transmitted between the inner conductor 104 and the amplifiers 52a-52n.

Figure 6:
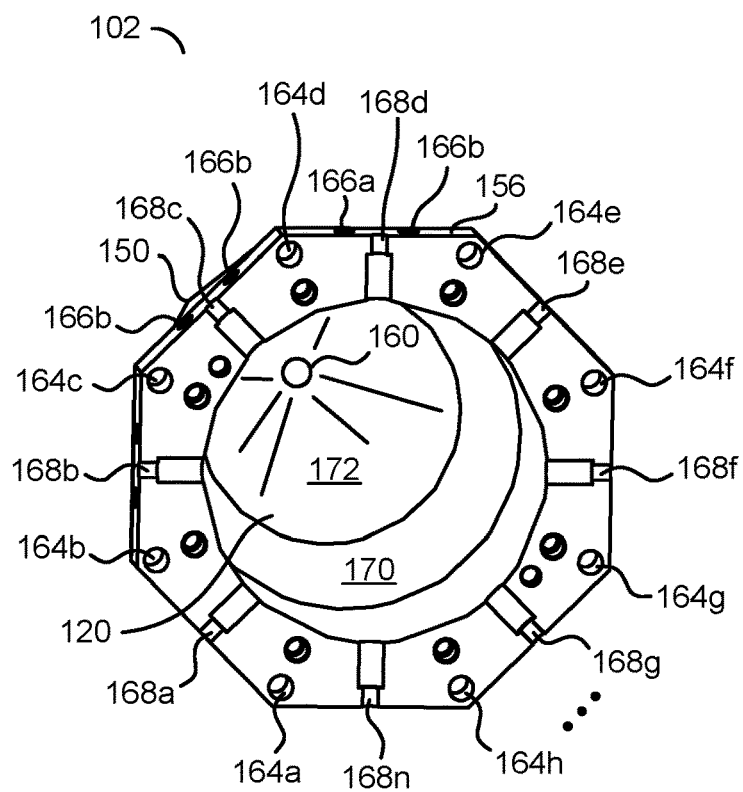
FIG. 6 is a diagram illustrating an alternate view of an example implementation of an outer conductor.

Referring to FIG. 6, a diagram illustrating an alternate view of an example implementation of an outer conductor is shown. A back and inside of the outer conductor 102 is shown. For illustrative purposes, the inner conductor 104 is not shown within the outer conductor 102.

A portion of the outer cylindrical surface 150 is shown along with the backplate 156. The through holes 164a-164n are shown located around the backplate 156. The mounting pairs 166a-166b are shown on the backplate 156. Openings 168a-168n are shown. The openings 168a-168n may comprise probe openings. The probe openings 168a-168n may be implemented around the backplate 156 (e.g., aligned to a middle of each of the mounting pairs 166a-166b). The probe openings 168a-168n may be implemented on each edge of the backplate 156. In the example shown, the backplate 156 may comprise eight of the probe openings 168a-168n. The number of the through holes 164a-164n, the mounting pairs 166a-166b and/or the probe openings 168a-168n may be varied according to the design criteria of a particular implementation.

The probe openings 168a-168n may extend through the backplate 156. The probe openings 168a-168n may each enable access from the outside of the outer conductor 102 to the inside of the outer conductor 102 (e.g., the cavity 120). The probe openings 168a-168n may be configured as an opening for a respective one of the probes 112a-112n of the inner conductor 104. For example, the probes 112a-112n may extend from the blades 110a-110n of the inner conductor 104, through the probe openings 168a-168n and may be connected to a connector (e.g., a connector connected to the backplate 156 by the mounting pairs 166a-166b). The solid plate that covers the backplate 156 may similarly provide probe openings. The probe openings 168a-168n may enable communication of the component signals MW_A-MW_N and/or the component signals C_A-C_N via the probes 112a-112n.

The inside of the outer conductor 102 is shown. The inside of the outer conductor 102 may comprise an inner (or inside) surface 170 and an inner (or inside) surface 172. The inside surface 170 may be an inner surface of the outer cylindrical portion 150. The inside surface 172 may be an inner surface of the outer taper surface 152. The opening 160 is shown on the inner surface 172. The empty physical space within the inner surface 170 and the inner surface 172 may comprise the cavity 120. The inner conductor 104 may fit within the cavity 120.

In the example shown, the outer conductor 102 may not comprise the blades 110a-110n. The example embodiment shown may correspond to the implementation of the broadband power circuit 100 shown in association with FIG. 2. In embodiments of the broadband power circuit 100 shown in association with FIG. 3, the inside surface 170 may comprise the blades 110a-110n. For example, the blades 110a-110n may be implemented around the inside surface 170 and extend within the cavity 120. Generally, the blades 110a-110n may extend along a length of the inside portion 170. The blades 110a-110n may not extend from the inner portion 172. For example, the shape of the blades 110a-110n may extend the farthest into the cavity 120 at the backplate 156, and may gradually taper down to meet the inside surface 170 before the outer conductor 102 transitions from the inside surface 170 to the inside surface 170.

Figure 7:
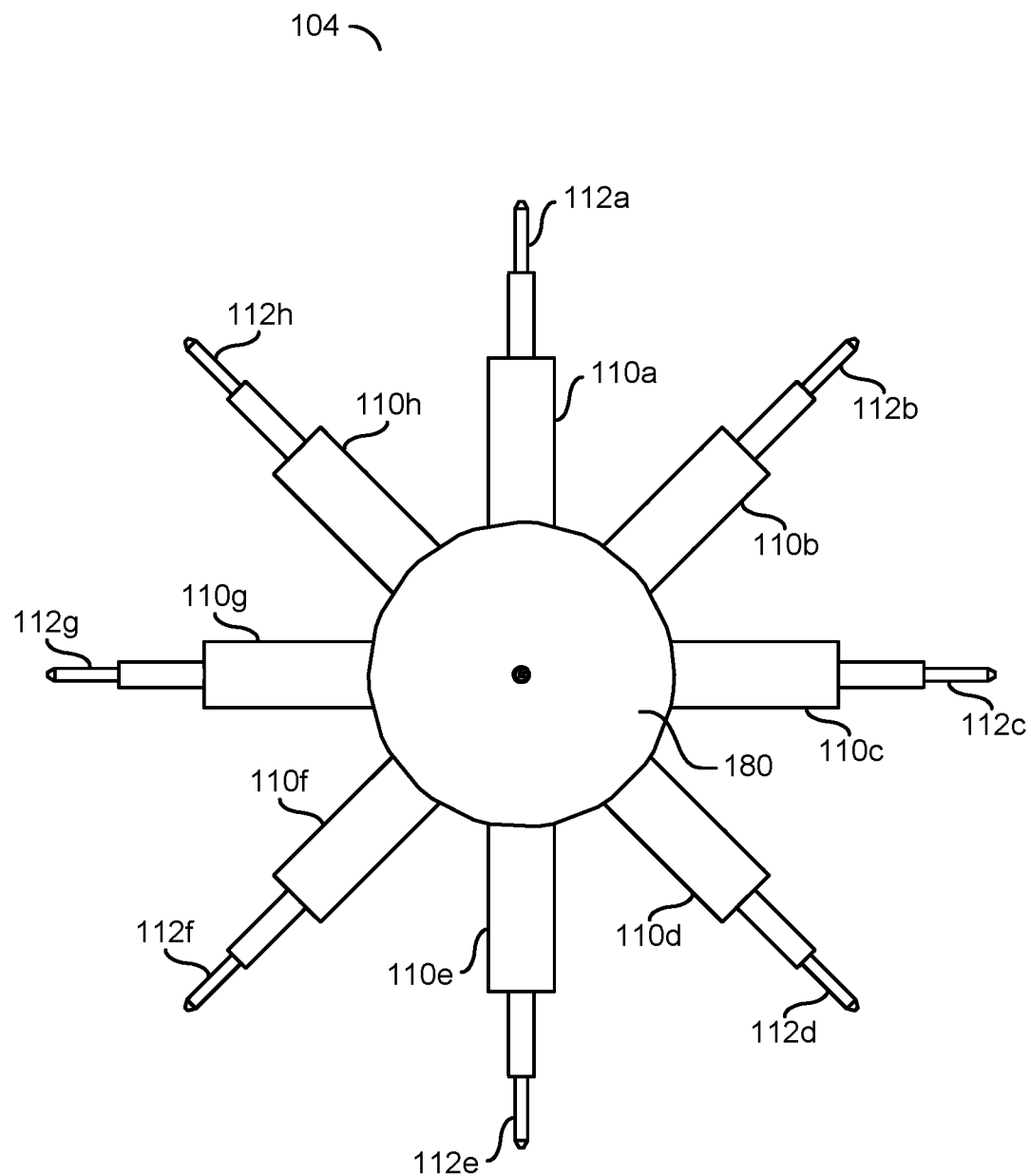
FIG. 7 is a diagram illustrating a view of an example implementation of an inner conductor.

Referring to FIG. 7, a diagram illustrating a view of an example implementation of an inner conductor is shown. A front view of the inner conductor 104 is shown. The inner conductor 104 is shown without (outside of) the outer conductor 102 for illustrative purposes.

A tapered end 180 of the inner conductor 104 is shown. The tapered end 180 may comprise a generally conical shape that meets at a tip at the front end of the inner conductor 104. The tip of the inner conductor 104 may communicate the signal I/O. A base of the tapered end 180 may be attached to a cylindrical portion of the inner conductor 104. From the front perspective shown, the cylindrical portion of the inner conductor 104 may be blocked from view by the base of the tapered end 180. Details of the cylindrical portion of the inner conductor 104 may be described in association with FIG. 8.

The blades 110a-110h are shown arranged around the inner conductor 104. The blades 110a-110h may not be extending from the tapered end 180. The blades 110a-110h may extend from the cylindrical portion of the inner conductor 104. The probes 112a-112h are each shown extending from a respective one of the blades 110a-110h. In the example shown, eight of the blades 110a-110h and eight of the probes 112a-112h may be implemented. The number of blades 110a-110n implemented may correspond to the number of the amplifiers 52a-52n implemented. The number of the blades 110a-110n (and the respective probes 112a-112n) may be varied according to the design criteria of a particular implementation.

Each of the probes 112a-112h may be connected to a connector (e.g., a coaxial connector, not shown) to communicate the component signals MW_A-MW_N and/or the component signals C_A-C_N via a coaxial cable. The blades 110a-110h may be evenly spaced around the outer surface of the inner conductor 104. For example, a distance between the blade 110a to the blade 110b may be the same distance as the distance between the blade 110b to the blade 110c. In an example with eight of the blades 110a-110h implemented, the blade 110a may be directly across from the blade 110e. The blades 110a-110n may be symmetrically located around the inner surface 104. Implementing the blades 110a-110n symmetrically around the inner surface 104 may enable the blades 110a-110n to be electromagnetically symmetric.

The electromagnetically symmetric arrangement of the blades 110a-110n may enable an equal amplitude and phase distribution among the split signals and/or the combined signals. The arrangement of the blades 110a-110n may ensure that the splitting and/or combining of the component signals MW_A-MW_N (or the amplified component signals C_A-C_N) do not have a low frequency cutoff (e.g., is operational down to direct current).

Figure 8:
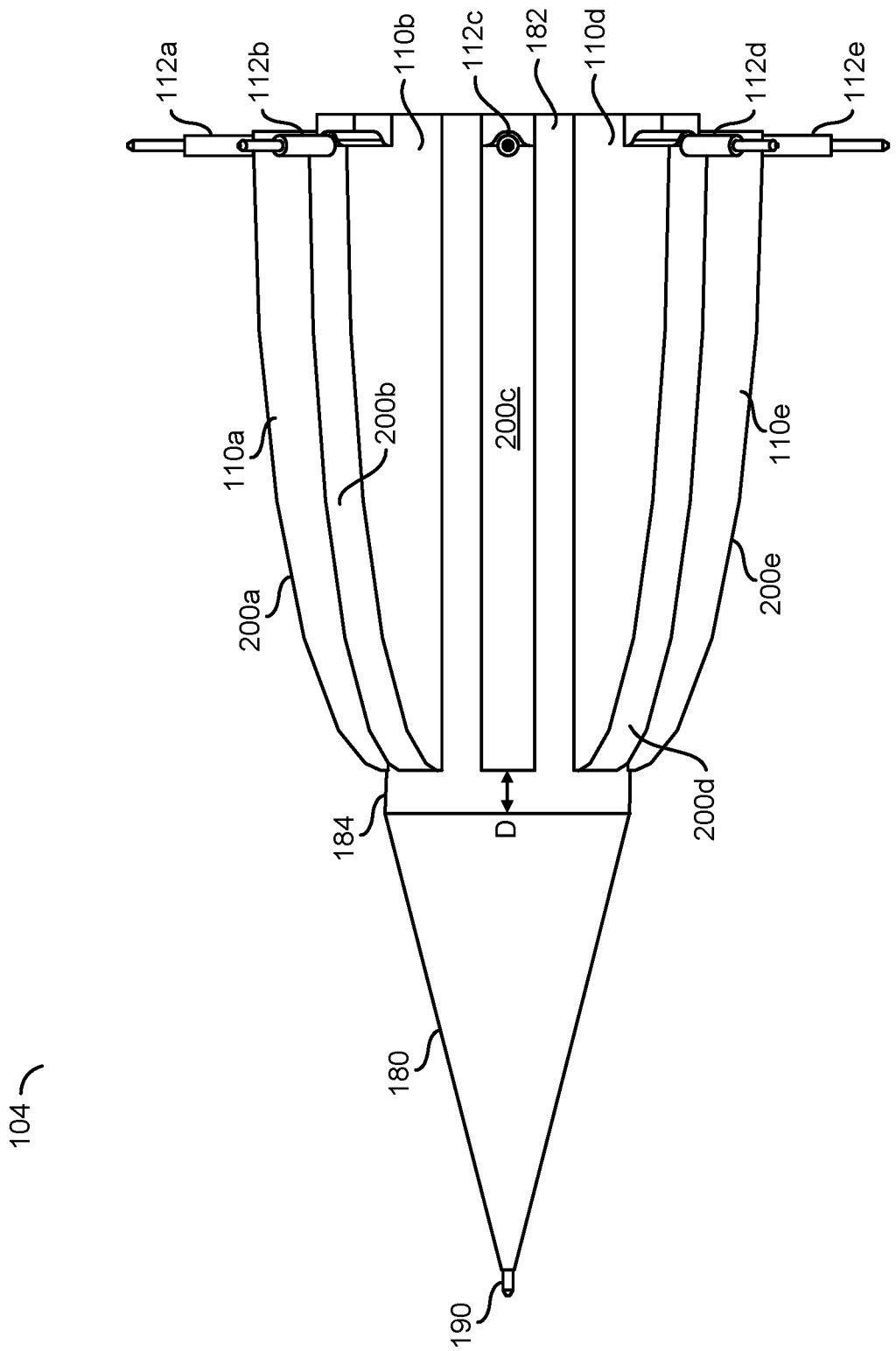
FIG. 8 is a diagram illustrating a side view of an example implementation of an inner conductor.

Referring to FIG. 8, a diagram illustrating a side view of an example implementation of an inner conductor is shown. The side view of the inner conductor 104 is shown without the outer conductor 102 for illustrative purposes. Less than all of the blades 110a-110n and the probes 112a-112n are shown in the side view of the inner conductor 104. In an example, for an implementation of the inner conductor 104 with eight of the blades 110a-110h, the side view of the inner conductor 104 may show the blade 110a, the blade 110b, the blade 110c, the blade 110d and the blade 110e along with the respective probes 112a-112e (e.g., the blades 110f-110h and the corresponding probes 112f-112h may not be visible from the side view shown).

The inner conductor 104 may comprise the tapered end 180 and a cylindrical portion 182-184. The cylindrical portion 182-184 may comprise a bladed portion 182 and a transition portion 184. The bladed portion 182 of the cylindrical portion 182-184 may comprise the blades 110a-110n. The blades 110a-110n may extend along a length of the cylindrical portion 182-184 up to the transition portion 184. A distance (e.g., D) is shown. The distance D may be the length of the transition portion. The distance D may be a distance that the blades 110a-110n are shorter than the cylindrical portion 182-184. For example, if the cylindrical portion 182-184 is implemented with a length of 3 inches and the distance D is 0.15 inches, then the length of the blades 110a-110n may be 2.85 inches.

The blades 110a-110n may extend along the length of the bladed portion 182 from one end of the inner conductor 104 up to the transition portion 184. The transition portion 184 may be connected to the tapered end 180. A base of the tapered end 180 may be connected to the transition portion 184. The conical shape of the tapered end 180 may form a point at one end of the inner conductor 104. The tapered end 180 may implement an I/O transition. An I/O probe 190 is shown at the tip of the tapered end 180. The I/O probe 190 may be configured to attach to a connector (not shown). The connector may enable the I/O probe 190 to connect to a coaxial cable. The probe 190 may be configured to transmit the signal I/O.

The blades 110a-110n are each shown comprising a respective one of the edges 200a-200n. The edges 200a-200n may be a top edge of the blades 110a-110n. For example, the blades 110a-110n may extend outwards (e.g., radially) from the cylindrical portion 182-184. The edges 200a-200n may be the outermost portion of the blades 110a-110n. The probes 112a-112n of the blades 110a-110n may extend from the edges 200a-200n.

The blades 110a-110n are shown having a shape. The edges 200a-200n may be a contoured shape. The contoured shape of the edges 200a-200n may gradually meet the cylindrical portion 182-184 of the inner conductor 104. The edges 200a-200n may be farthest away from the surface of the inner conductor 104 at one end with the probes 112a-112n. The contoured shape of the edges 200a-200n may gradually curve down towards the cylindrical portion 182-184. The end of the edges 200a-200n without the probes 112a-112n may meet with the bladed portion 182 at the transition portion 184. In an example, the blades 110a-110n may each extend along a length of the cylindrical portion 182-184 with a predetermined shape of the edges 200a-200n. The predetermined shape of the edges 200a-200n may have a respective one of the probes 112a-112n at one end and a second end of the predetermined shape of the edges 200a-200n may gradually meets the cylindrical portion 182-184 at the distance D from the tapered end 180. The predetermined shape of the edges 200a-200n may provide a low-loss transition from a microwave signal propagating between the I/O probe 190 and the probes 112a-112n.

The blades 110a-110n may have a width (e.g., the width of the edges 200a-200n). The width of the edges 200a-200n may be selected to tune the performance of the broadband power circuit 100. Similarly, the height and/or shape of the blades 110a-110n may be selected to tune the performance of the broadband power circuit 100. The width, height and/or shape of the blades 110a-110n may be varied according to the design criteria of a particular implementation.

In embodiments where the broadband power circuit 100 implements a broadband splitter, the signal I/O communicated by the I/O probe 190 may be an input signal. The tapered end 180 may transmit the input signal I/O to the blades 110a-110n. The blades 110a-110n may be arranged symmetrically to split the input signal I/O into the component signals MW_A-MW_N. The probes 112a-112n may implement an interface to the amplifiers 52a-52n. The probes 112a-112n may provide the split component signals MW_A-MW_N to a respective one of the amplifiers 52a-52n.

In embodiments, where the broadband power circuit 100 implements a broadband combiner, the signal I/O communicated by the I/O probe 190 may be an output signal. The probes 112a-112n may implement an interface to the amplifiers 52a-52n. The probes 112a-112n may provide the amplified component signals C_A-C_N to the blades 110a-110n. The blades 110a-110n may be arranged electromagnetically symmetrical to combine the amplified component signals C_A-C_N into the output signal I/O. The tapered end 180 may transmit the combined component signals C_A-C_N from the blades 110a-110n to the I/O probe 190.

Figure 9:
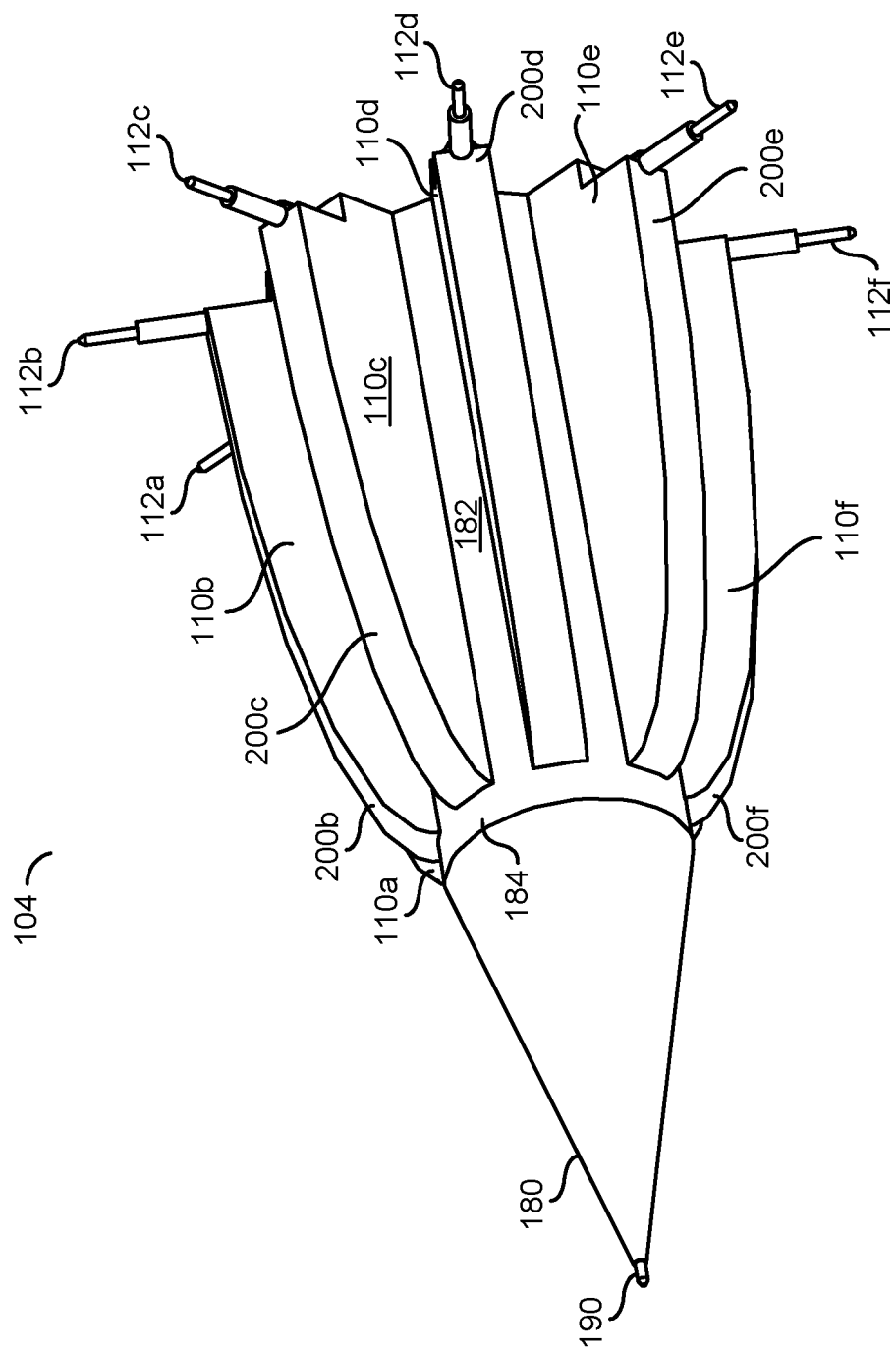
FIG. 9 is a diagram illustrating an alternate view of an example implementation of an inner conductor.

Referring to FIG. 9, a diagram illustrating an alternate view of an example implementation of an inner conductor is shown. A perspective view of the inner conductor 104 is shown. The perspective view of the inner conductor 104 is shown without the outer conductor 102 for illustrative purposes.

The tapered end 180, the I/O probe 190, the transition portion 184 and the bladed portion 182 of the inner conductor 104 are shown. The blades 110a-110n and the respective probes 112a-112n are shown extending radially from the cylindrical portion 182-184. The edges 200a-200n are shown having the predetermined shape that gradually meets with the cylindrical portion 182-184 before the transition portion 184 (e.g., a distance D from the tapered end 180).

The I/O probe 190 may be configured to implement an interface for one coaxial connector (e.g., to communicate the signal I/O). The probes 112a-112n may be configured to implement an interface for more than one coaxial connector. The inner conductor 104 may be implemented within the cavity 120. The coaxial connector (not shown) may be connected to the I/O probe 190 of the tapered end 180. The I/O probe 190 and/or the conical shape of the tapered end 180 may provide a transition for the tapered end 180 to communicate the signal I/O to/from the blades 110a-110n. Each of the coaxial connectors may be connected to the probes 112a-112n of the respective blades 110a-110n. The edges 200a-200n of the blades 110a-110n may have the predetermined shape to enable each of the blades 110a-110n to be configured to provide a low-loss transition for a microwave signal. The microwave signal may propagate between the coaxial connectors attached to the probes 112a-112n and the coaxial connector connected to the I/O probe 190.

In some embodiments, a direction of energy flow within the broadband power circuit 100 may be from one end to another end of the blades 110a-110n along the predetermined shape of the edges 200a-200n. The arrangement of the blades 110a-110n and/or the predetermined shape of the edges 200a-200n may provide a low-loss transition for communicating the component signals MW_A-MW_N and/or the component signals C_A-C_N. The low-loss transition may limit and/or reduce an amount of reflective loss and an amount of ohmic loss.

The low-loss transition provided by the blades 110a-110n may prevent reflective losses and/or ohmic losses during amplification. For example, the amplifier circuits 52a-52n may be connected to the probes 112a-112n. In an example when the broadband power circuit 100 is implemented as a splitter, the blades 110a-110n may be configured to fan out the inputs to multiple of the amplifier circuits 52a-52n. Implementing multiple of the amplifier circuits 52a-52n may enable more output power to be generated by individually amplifying each of the component signals MW_A-MW_N. In an example when the broadband power circuit 100 is implemented as a combiner, the blades 110a-110n may be configured to fan in the outputs (e.g., the amplified component signals C_A-C_N). In an example of an 8 to 1 structure (e.g., the input probe 190 to eight of the blades 110a-110n), the structures may be electromagnetically symmetric. The input signal I/O may be split equally among the eight conductors (e.g., the blades 110a-110n). For example, if all eight of the blades 110a-110n are driven symmetrically with the same amplitude and phase signal for the component signals MW_A-MW_N, low-loss combining may be performed on the amplified component signals C_A-C_N.

In an example, the blades 110a-110n preserve an impedance to provide the low-loss transition. In an example, the electromagnetically symmetrical implementation of the blades 110a-110n and/or the predetermined shape of the blades 110a-110n may enable impedance matching without adding an additional resistor (which would result in waste power loss). The blades 110a-110n may ensure that implementing resistive elements may be avoided. The blades 110a-110n may provide impedance transformation. The impedance transformation may prevent reflective losses.

Figure 10:
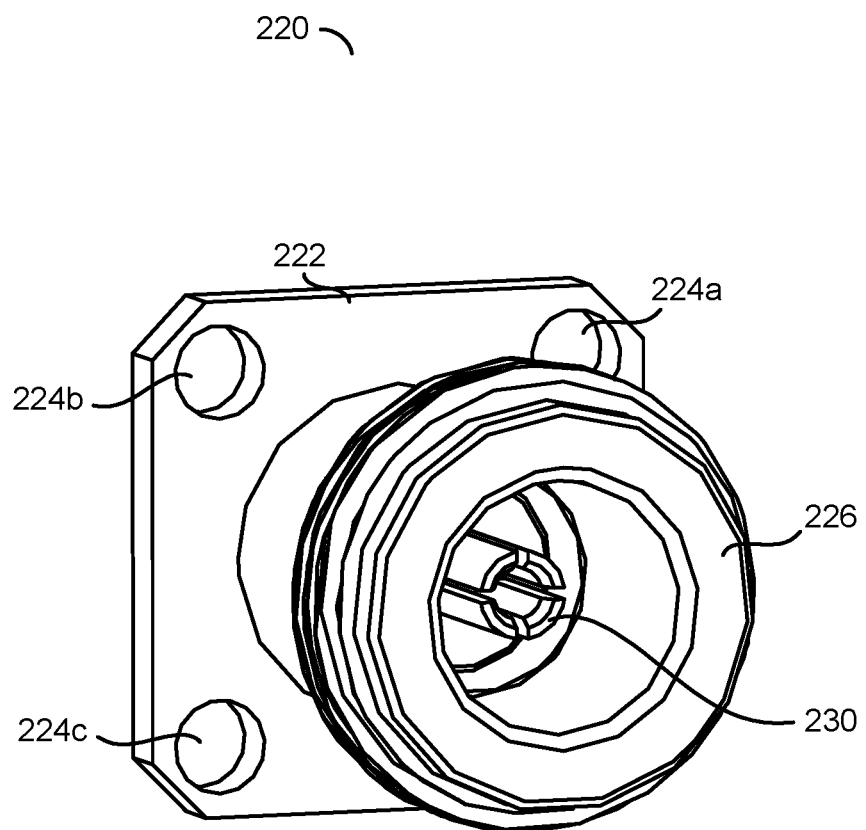
FIG. 10 is a diagram illustrating a view of a coaxial connector.

Referring to FIG. 10, a diagram illustrating a view of a coaxial connector is shown. A connector 220 is shown as a representative example of one or more coaxial connectors that may be attached to the outer conductor 102. In an example, the connector 220 may implement a coaxial connector that may be configured to be secured to (e.g., establish a communications connection) a coaxial cable.

In one example, the connector 220 may be configured to be attached to the front end 154. In another example, the connector 220 may be attached to the backplate 156 and/or the solid plate. A number of implementations of the connector 220 may be attached to the outer conductor 102. The number of implementations of the connector 220 may be varied according to the design criteria of a particular implementation.

The connector 220 may comprise a base 222. The base 222 is shown as a flat, rectangular shape. The base 222 may enable the connector 220 to sit flat on a surface of the outer conductor 102.

The base 222 may comprise a number of openings 224a-224n. From the perspective shown, the openings 224a-224c are visible. In the example shown, there may be four of the openings (e.g., 224a-224d) implemented. The openings 224a-224n may be through holes. The through holes 224a-224n may be configured to enable a securing device (e.g., a screw, a bolt, etc.) to be pushed through the base 222. For example, the connector 220 may be attached and secured to the outer conductor 102 via screws inserted through the through holes 224a-224b.

The connector 220 may comprise an adapter 226. The adapter 226 is shown extending from the base 222. For example, the base 222 may sit flat on the outer conductor 102 and the adapter 226 may extend outwards from the surface of the outer conductor 102. The adapter 226 may be configured to receive a coaxial cable.

The connector 220 may comprise an interface 230. The interface 230 is shown within the adapter 226. The interface 230 may be configured to attach to the I/O probe 190 and/or one of the probes 112a-112n. In one example, the interface 230 may be configured to electrically connect a coaxial cable to an input/output of the broadband power circuit 100. The interface 230 may provide a coaxial connector with a blind mate.

In one example, the connector 220 may be configured to be attached to the front end 154 of the outer conductor 102. For example, the interface 230 may be located above the opening 160. The I/O probe 190 of the inner conductor 104 may extend through the opening 160 and connect to the interface 230. The through holes 224a-224d may be configured to align with the openings 162a-162d. A screw may extend through the through holes 224a-224d and the openings 162a-162d to secure the connector 220 to the front end 154.

In one example, the connector 220 may be configured to be attached to the backplate 156 and the solid plate of the outer conductor 102. For example, the interface 230 may be located above one of the probe openings 168a-168n. One implementation of the connector 220 may be implemented for each of the probe openings 168a-168n. The probes 112a-112n of the blades 110a-110n within the outer conductor 102 may extend through the probe openings 168a-168n and connect to the interface 230. The through holes 224a-224d may be configured to align with the mounting pairs 166a-166b of the backplate 156 and the complementary mounting pairs on the solid plate. A screw may extend through the through holes 224a-224d and the mounting pairs 166a-166b to secure the connector 220 to the backplate 156 and the solid plate.

In the example shown, the connector 220 is implemented as a coaxial connector. In one example, the coaxial connector 220 may be implemented having a custom design (e.g., non-standard dimensions selected for a specific implementation of the broadband power circuit 100). In another example, the coaxial connector 220 may be implemented as one of many available standardized coaxial connectors (e.g., BNC, Type-N, SMA, 2.92-mm, 2.4-mm, etc.). The type of the coaxial connector 220 implemented may be varied according to the design criteria of a particular implementation.

Figure 11:
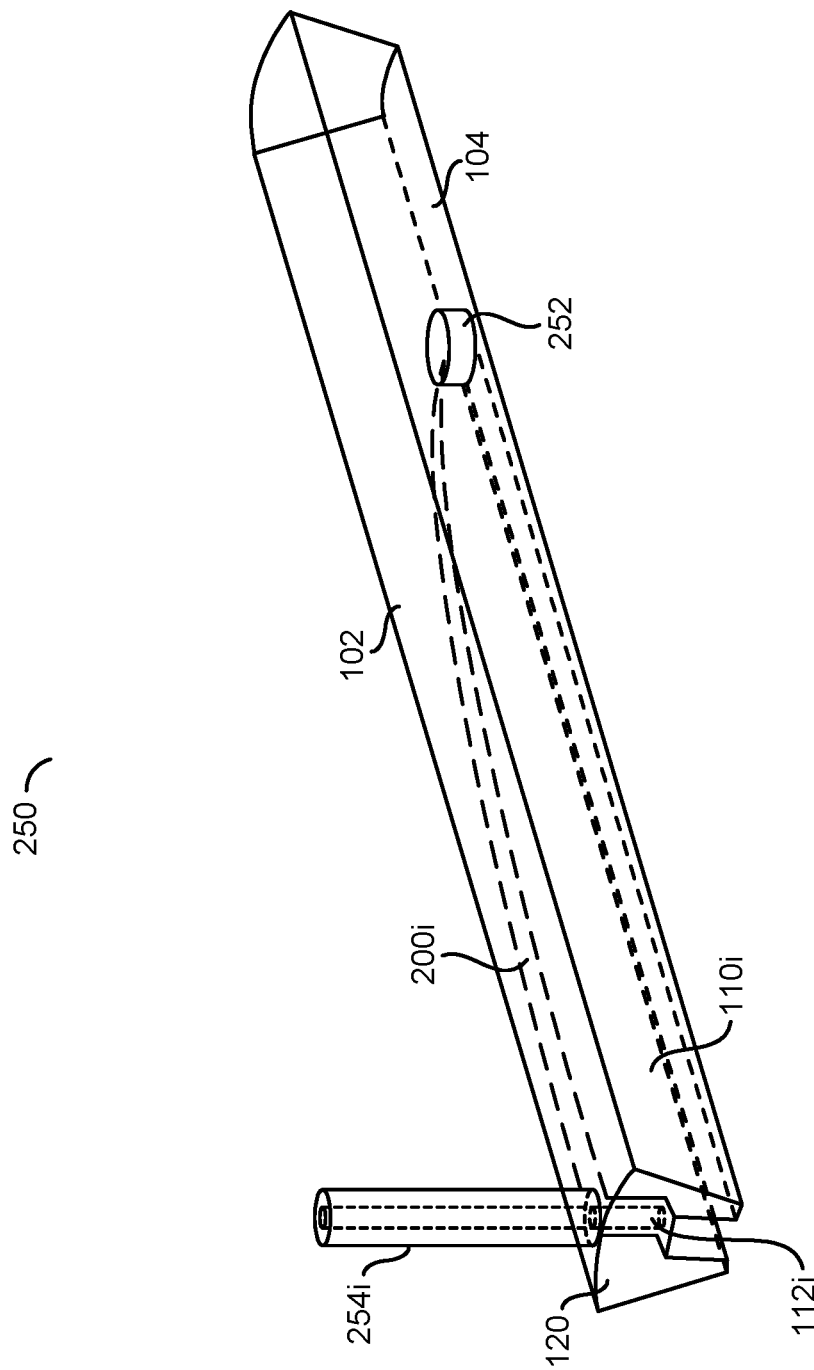
FIG. 11 is a diagram illustrating a tuning structure connected at one end of a blade.

Referring to FIG. 11, a diagram illustrating a tuning structure connected at one end of a blade is shown. A portion 250 of the outer conductor 102 and the inner conductor 104 is shown. The portion 250 of the outer conductor 102 and the inner conductor 104 shown, may correspond to the blade 110i. While the blade 110i is shown for illustrative purposes, the description may apply to each of the blades 110a-110n, and all of the outer conductor 102 and the inner conductor 104.

The inner conductor 104 is shown within the outer conductor 102. The edge 200i of the blade 110i is shown extended towards the inner surface of the outer conductor 102. The edge 200i is shown having the predetermined shape that gradually meets the inner conductor 104. The probe 112i is shown extending from the blade 110i. The cavity 120 is shown between the edge 200i, the blade 110i, the probe 112i, inner surface 104 and the inner surface of the outer conductor 102.

A block (or circuit) 252 is shown. The circuit 252 may implement a tuning structure. While one tuning structure 252 is shown as an illustrative example attached near the blade 110i, one implementation of the tuning structure 252 may be implemented near each of the blades 110a-110n (e.g., tuning structures 252a-252n may be implemented for the corresponding blades 110a-110n).

The tuning structure 252 is shown at one end of the blade 110i. The tuning structure 252 is shown at the end of the blade 110i that has the edge 200i meet the inner conductor 104. For example, the tuning structure 252 may be implemented at the transition portion 184 of the inner conductor 104.

In some embodiments, the tuning structure 252 may be implemented at an end of the edge 200i with the probe 112i. In an example, the tuning structure 252 may be located next to the probe 112i. The tuning structure 252 may implement a backshort tuner. In some embodiments, the tuning structure 252 implemented for the blade 110a may be located at the transition portion 184 and the tuning structure 252 implemented for the blade 110b may be implemented near the probe 112b. The location of each tuning structure 252 implemented with respect to each of the blades 110a-110n may be varied according to the design criteria of a particular implementation.

A coaxial cable 254i is shown. The coaxial cable 254i is shown connected to the probe 112i. The coaxial cable 254i may connect to the broadband power circuit 100 at the probe 112i and connect to an interface of the amplifier circuit 52i. Each of the probes 112a-112n may be attached to a respective one of the coaxial cables 254a-254n. The coaxial cables 254a-254n may connect each of the probes 112a-112n to an interface of a respective one of the amplifier circuits 52a-52n.

Figure 12:
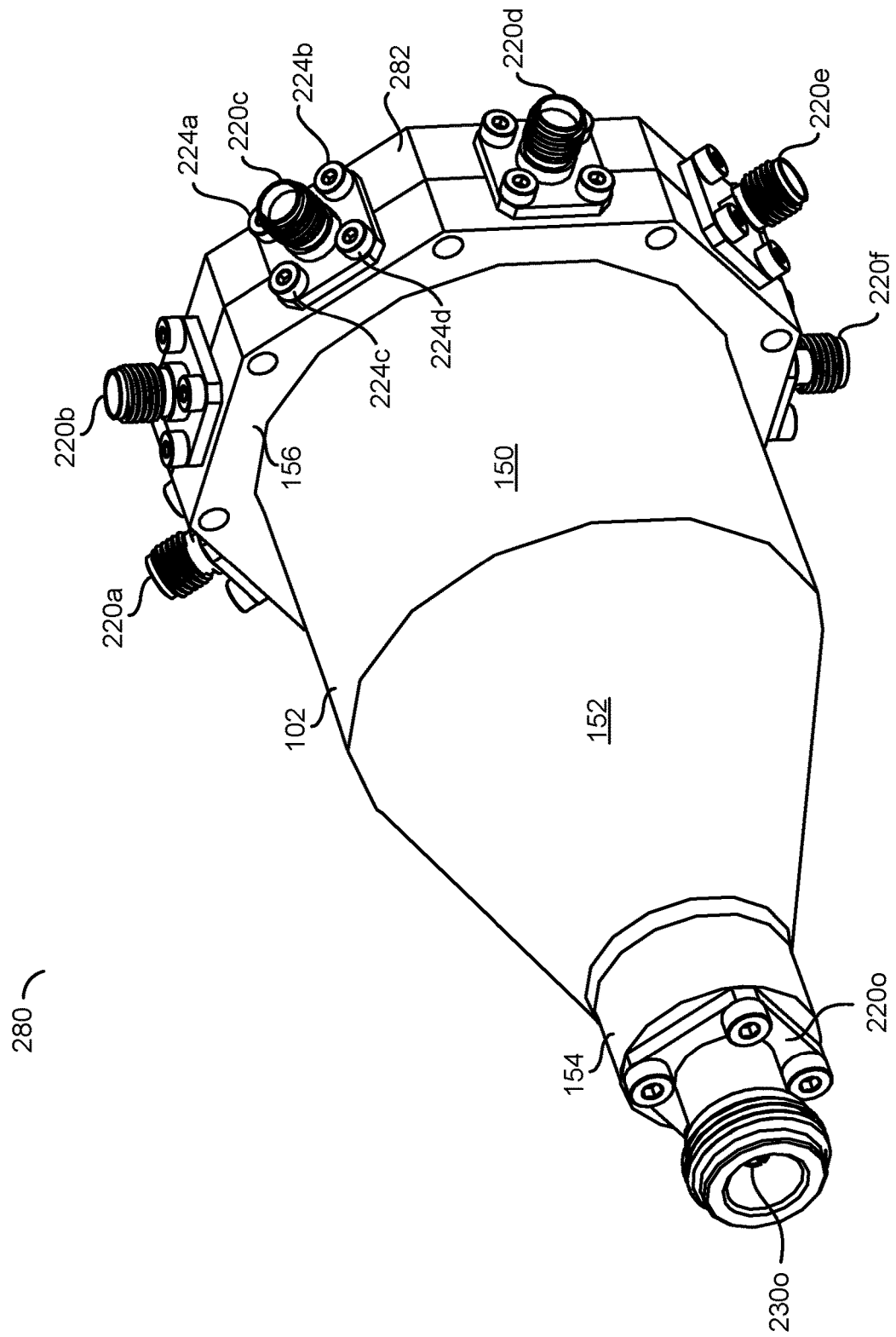
FIG. 12 is a diagram illustrating a view of an example embodiment of the present invention.

Referring to FIG. 12, a diagram illustrating a view of an example embodiment of the present invention is shown. A view 280 of the outer conductor 102 is shown. The view 280 may illustrate the outer conductor 102 with the connectors 220a-220n and the connector 220o attached. The connectors 220a-220n may enable the amplifier circuits 52a-52n to be connected to the broadband power circuit 100.

The first outer portion 150, the second outer portion 152, the front end 154 and the backplate 156 of the outer conductor 102 are shown. The solid plate 282 is shown. The solid plate 282 may be attached to the backplate 156. The backplate 156 may be open (as shown in association with FIG. 6). The solid plate 282 may provide a full cover for the outer conductor 102. The solid plate 282 may seal the cavity 120 within the outer conductor 102. For example, the inner conductor 104 may be inside the outer conductor 102 in the cavity 120 and the solid plate 282 may seal the inner conductor 104 within the outer conductor 102.

The solid plate 282 may be secured to the backplate 156 using securing components (e.g., screws, bolts, etc.) in the through holes 164a-164n. The solid plate 282 may comprise complementary through holes that align with the through holes 164a-164n of the backplate 156.

The connectors 220a-220n are shown attached to the backplate 156 and the solid plate 282. The openings 224c-224d of each of the connectors 220a-220n may be aligned with the mounting pairs 166a-166b to secure one half of the connectors 220a-220n to the backplate 156. The solid plate 282 may comprise mounting pairs that are lined up across from the mounting pairs 166a-166b of the backplate 156. The mounting pairs 166a-166b of the backplate 156 and the mounting pairs (hidden from view due to being covered by the connectors 220a-220n) may form a square arrangement of openings that may be configured to align with the openings 224a-224d of the connectors 220a-220n. The openings 224a-224b of each of the connectors 220a-220n may be aligned with the mounting pairs to secure one half of the connectors 220a-220n to the solid plate 282. Securing components (e.g., screws) may be inserted through the openings 224a-224d and into the mounting pairs 166a-166b and the mounting pairs of the solid plate 282 to securely attach the connectors 220a-220n flat against the outer conductor 102.

The connectors 220a-220n may be arranged radially around an outside circumference of the outer conductor 102. The connectors 220a-220n may be aligned with the probes 112a-112n. The connectors 220a-220n may enable the respective coaxial cables 254a-254n to be connected to the respective probes 112a-112n. The connectors 220a-220n may enable the amplifier circuits 52a-52n to be arranged around an outside circumference of the outer conductor 102.

The connector 220o is shown attached to the front end 154. The openings 224a-224d of the connector 220o may be configured to align with the openings 162a-162d of the front end 154. Securing components (e.g., screws) may be inserted through the openings 224a-224d and into the openings 162a-162d to securely attach the connector 220o flat against the front end 154 of the outer conductor 102.

The interface 2300 of the connector 220o is shown. The interface 230o may be aligned with the opening 160 of the front end 154. The interface 230o may be a coaxial connector. The I/O probe 190 may be configured to connect to the interface 2300. The interface 230o may enable the signal I/O to be transmitted via a coaxial cable.

The broadband power circuit 100 may be approximately 3-5 inches in length. For example, a distance from the solid plate 282 to the front end 154 may be approximately 5 inches in length. The length of the broadband power circuit 100 may be varied according to the design criteria of a particular implementation.

Figure 13:
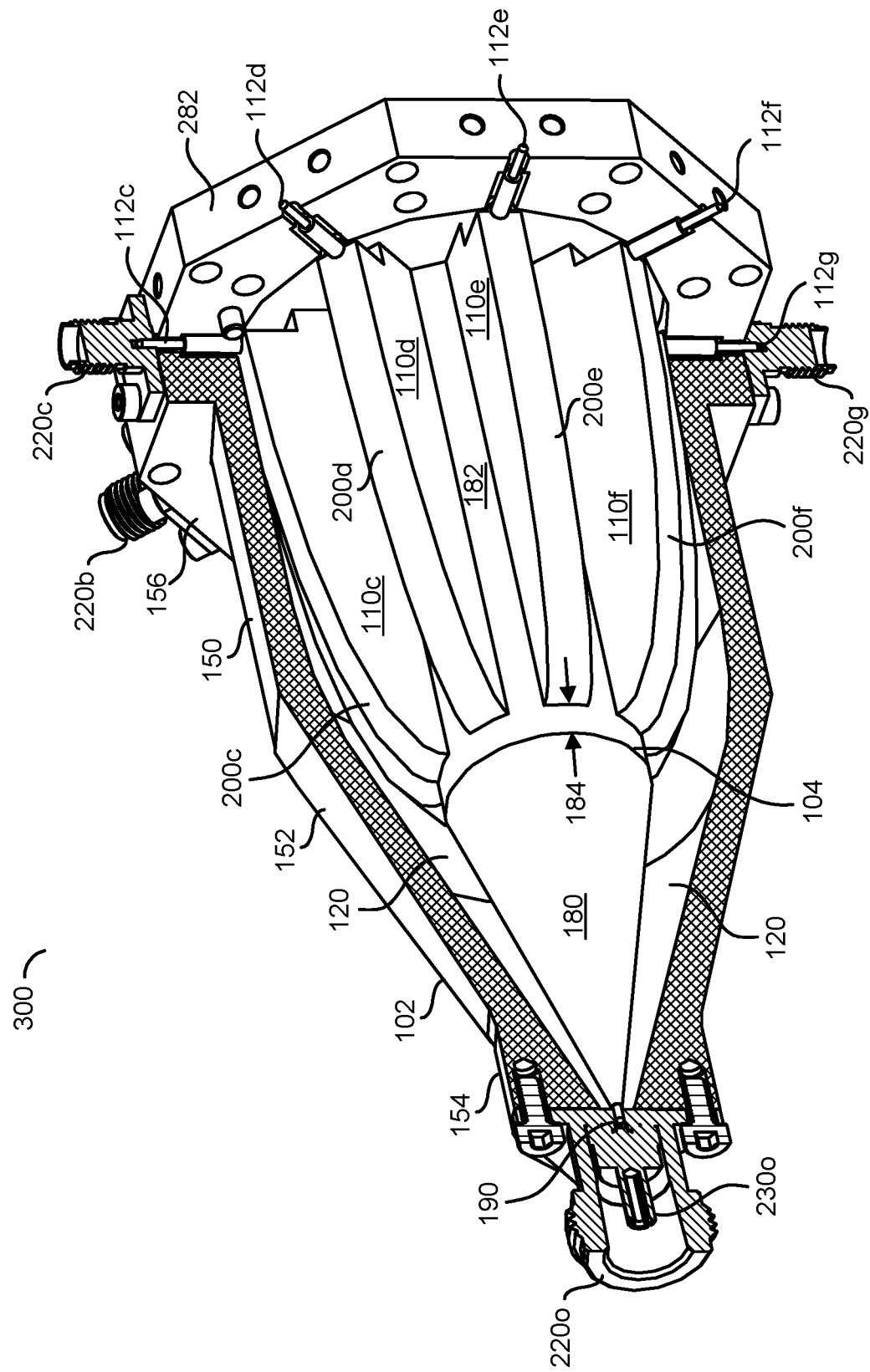
FIG. 13 is a diagram illustrating a cutaway view of an outer conductor showing an inner conductor within.

Referring to FIG. 13, a diagram illustrating a cutaway view of an outer conductor showing an inner conductor within is shown. A view 300 of the outer conductor 102 and the inner conductor 104 is shown. The view 300 may comprise a cutaway view illustrating the inner conductor 104 within the outer conductor 102.

The cutaway view 300 may comprise the outer conductor 102 illustrated with half of the outer conductor 102 cut out for illustrative purposes to show the inner conductor 104 and the cavity 120. A cutaway of the first outer portion 150, the second outer portion 152, the front end 154 and the backplate 156 are shown. The solid plate 282 is shown. A cutaway view of the connector 220c and the connector 220g on the backplate 156 is shown. A cutaway view of the connector 220o on the front end 154 is shown.

The inner conductor 104 is shown within the cavity 120. The cylindrical portion 182-184 (e.g., the bladed portion 182 and the transition portion 184), the tapered end 180 and the I/O probe 190 of the inner conductor 104 are shown. The blades 110a-110n are shown arranged evenly spaced around the cylindrical portion 182-184. The probes 112a-112n are shown extending from the edges 200a-200n of the respective blades 110a-110n. The arrangement of the blades 110a-110n around the inner conductor 104 may enable the broadband power circuit 100 to implement broadband power combining. The broadband power combining may be performed at various octaves of bandwidth. In one example, the various octaves of bandwidth may comprise a frequency range from 2 GHz to 20 GHz. In another example, the various octaves of bandwidth may comprise a frequency range from 2 GHz to 20 GHz with up to 16-way combining (e.g., sixteen of the blades 110a-110n). The octaves of bandwidth implemented by the broadband power circuit 100 may be varied according to the design criteria of a particular implementation.

The probes 112a-112n are shown extending through a respective one of the probe openings 168a-168n of the backplate 156. As an illustrative example of the cutaway view of the connector 220c, the probe 112c is shown extending through the connector 220c. The connector 220c may enable a coaxial cable to be electrically connected to the probe 112c to enable communication of the component signal MW C and/or the amplified component signal C_C.

The I/O probe 190 is shown extending through the connector 220o. The I/O probe 190 may be electrically connected to the coaxial interface 2300 of the connector 220o. The coaxial interface 230o may enable a secure connection to a coaxial cable to enable the signal I/O to be communicated to/from the broadband power circuit 100.

Figure 14:
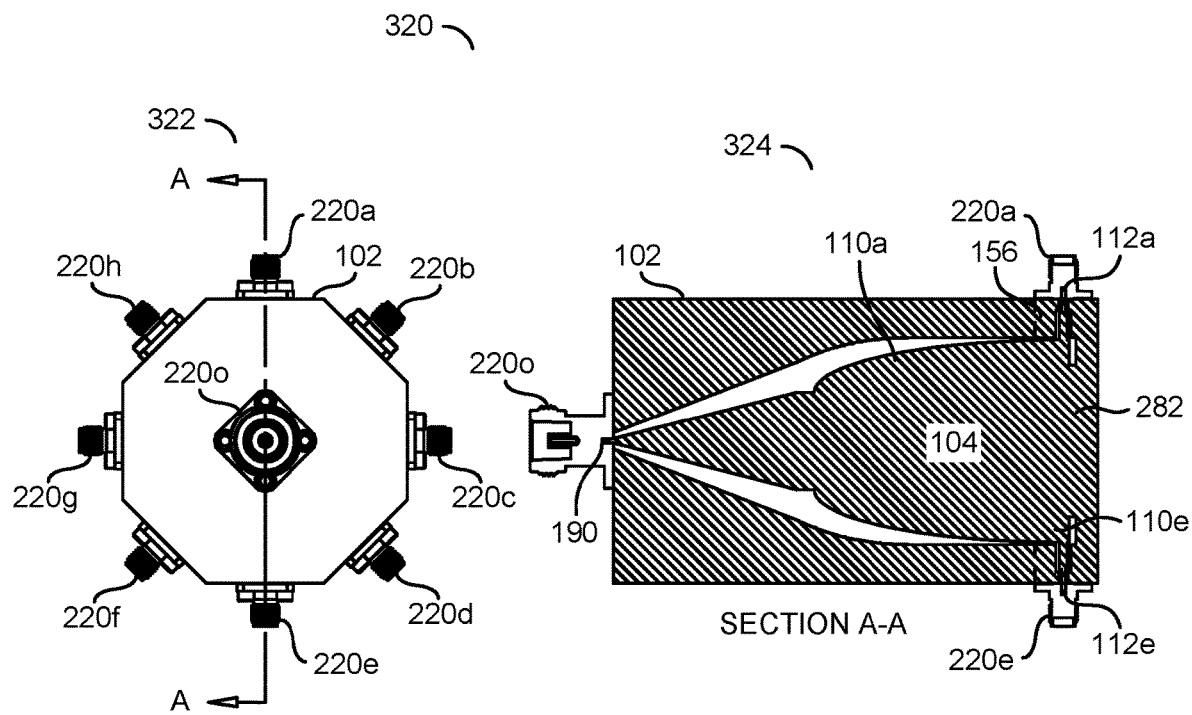
FIG. 14 is a diagram illustrating an example embodiment with coaxial connectors implemented on an outer radius of an outer conductor.

Referring to FIG. 14, a diagram illustrating an example embodiment with coaxial connectors implemented on an outer radius of an outer conductor is shown. An example embodiment 320 is shown. The example embodiment 320 may be illustrated with a front view 322 and a cross-section view 324. The example embodiment 320 may have a similar configuration as the example embodiment of the broadband power circuit 100 shown in association with FIG. 13.

The front view 322 may comprise the outer conductor 102. The coaxial connectors 220a-220h are shown attached to the outer conductor 102. In the example shown, the broadband power circuit 100 may be implemented with eight of the probes 112a-112h. The coaxial connectors 220a-220h may be arranged around an outer radius of the outer conductor 102. For example, the coaxial connectors 220a-220h may be evenly spaced in a generally circular arrangement around the outside of the outer conductor 102. While the coaxial connectors 220a-220h are shown attached the outer conductor 102, the coaxial connectors 220a-220h may be attached to the backplate 156 and the solid plate 282, which is attached to the first outer portion 150 of the outer conductor 102.

The front view 322 may comprise the coaxial connector 220o. The coaxial connector 220o may be attached to the front end 154 of the outer conductor 102. The coaxial connector 220o may be visible when viewing the broadband power circuit 100 head on. A cross-section line A-A is shown down the middle of the outer conductor 102 in the front view 322. The cross-section line A-A may cross the middle of the coaxial connector 220a, the coaxial connector 220o and the coaxial connector 220e.

The cross-section view 324 may provide a side view of the outer conductor 102 and the inner conductor 104 from the perspective shown by the cross-section line A-A. A cross-section of the outer conductor 102, the inner conductor 104, the blade 110a, the blade 110e, the probe 112a, the probe 112e, the backplate 156, the I/O probe 190, the coaxial connector 220a, the coaxial connector 220e, the coaxial connector 220o and the solid plate 282 is shown.

The blades 110a-110n may extend out from the inner conductor 104. The tapered end 180 of the inner conductor 104 may extend to the outer conductor 102 with the I/O probe 190 at the front end 154. The probe 112a may extend from the inner conductor 104 (e.g., the blade 110a) to the outer radius of the outer conductor 102 near the solid plate 282. The probe 112e may extend from the inner conductor 104 (e.g., the blade 110e) to the outer radius outer conductor 102 near the solid plate 282. The I/O probe 190 may be connected to the coaxial connector 2200, the probe 112a may be connected to the coaxial connector 220a and the probe 112e may be connected to the coaxial connector 220e.

Figure 15:
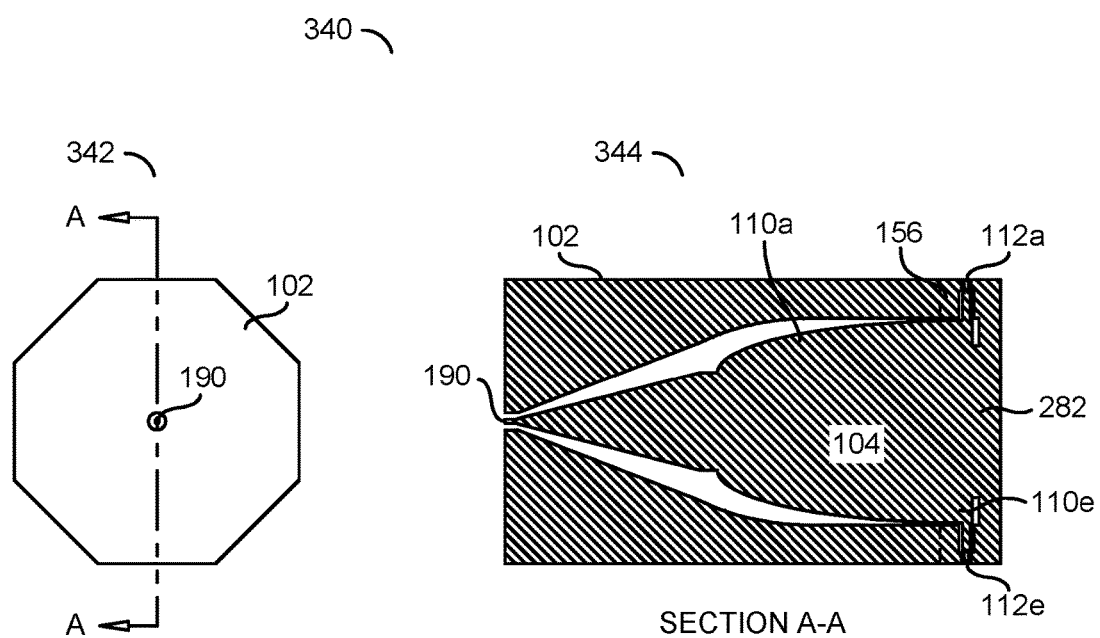
FIG. 15 is a diagram illustrating an example embodiment with probes extending out from an inner conductor to an outer radius of an outer conductor.

Referring to FIG. 15, a diagram illustrating an example embodiment with probes extending out from an inner conductor to an outer radius of an outer conductor is shown. An example embodiment 320 is shown. The example embodiment 340 may be illustrated with a front view 342 and a cross-section view 344. The example embodiment 340 may have a similar configuration as the example embodiment 320 of the broadband power circuit 100 shown in association with FIG. 14, but with the coaxial connectors 220a-220o removed.

The front view 342 may comprise the outer conductor 102. In the example shown, the probes 112a-112h are not shown extending from the outer conductor 102. For example, the probes 112a-112h may extend flush with the outer conductor 102 (or the backplate 156 and the solid plate 282) and may be attached to the respective coaxial connectors 220a-220h. In some embodiments, the probes 112a-112h may extend beyond the outer conductor 102 (or the backplate 156 and the solid plate 282) and may be attached to the coaxial connectors 220a-220h.

The I/O probe 190 is shown extending from the front end 154 of the outer conductor 102. In some embodiments, the I/O probe 190 may be flush with the front end 154 and may be connected to the coaxial connector 2200. In some embodiments, the I/O probe 190 may extend beyond the front end 154 and may be connected to the coaxial connector 2200. A cross-section line A-A is shown down the middle of the outer conductor 102 in the front view 342. The cross-section line A-A may cross the middle of the I/O probe 190.

The cross-section view 344 may provide a side view of the outer conductor 102 and the inner conductor 104 from the perspective shown by the cross-section line A-A without the coaxial connectors 220a-220h. A cross-section of the outer conductor 102, the inner conductor 104, the blade 110a, the blade 110e, the probe 112a, the probe 112e, the backplate 156, the I/O probe 190 and the solid plate 282 is shown.

The probe 112a is shown extending from the blade 110a. The blade 110a may extend from the inner conductor 104. The probe 112a may extend through to the outer radius of the outer conductor 102 (or the backplate 156 and the solid plate 282). Similarly, the probe 112e is shown extending from the blade 110e. The blade 110e may extend from the inner conductor 104. The probe 112e may extend through to the outer radius of the outer conductor 102 (or the backplate 156 and the solid plate 282). The tapered end 180 of the inner conductor 104 may extend to the outer conductor 102 with the I/O probe 190 at the front end 154.

Referring to FIG. 16, a diagram illustrating an example embodiment with coaxial connectors implemented extending from a back end is shown. An example embodiment 360 is shown. The example embodiment 360 may be illustrated with a front view 362, a cross-section view 364 and a back view 366. The example embodiment 360 may have a similar configuration as the example embodiment of the broadband power circuit 100 shown in association with FIG. 13, but with the probes 112a-112h extending from a back end (e.g., the end with the back plate 156 and/or the solid plate 282) of the broadband power circuit 100 instead of the outer radius.

The front view 362 may comprise the outer conductor 102. In the example shown, the outer conductor 102 may have a circular shape. Since the embodiment 360 does not implement the probes 112a-112h extending from the outer radius of the broadband circuit 100, the coaxial connectors 220a-220h may not be visible from the front view 362. The front view 362 may comprise the coaxial connector 2200. The coaxial connector 220o may be attached to the front end 154 of the outer conductor 102. The coaxial connector 220o may be visible when viewing the broadband power circuit 100 head on. A cross-section line A-A is shown down the middle of the outer conductor 102 in the front view 362. The cross-section line A-A may cross the middle of the coaxial connector 2200.

The cross-section view 364 may provide a side view of the outer conductor 102 and the inner conductor 104 from the perspective shown by the cross-section line A-A. A cross-section of the outer conductor 102, the inner conductor 104, the blade 110a', the blade 110e', the probe 112a, the probe 112e, the I/O probe 190, the coaxial connector 220a, the coaxial connector 220e, the coaxial connector 220o and the solid plate 282' is shown (for illustrative purposes, other of the coaxial connectors 220a-220h may have been omitted).

The blades 110a'-110n' may extend from the inner conductor. The tapered end 180 of the inner conductor 104 may extend to the outer conductor 102 with the I/O probe 190 at the front end 154. The I/O probe 190 may be connected to the coaxial connector 2200.

The probes 112a-112h may be configured to extend from a back of a respective one of the blades 110a'-110h'. For example, the blades 110a'-110h' may be configured with the probes 112a-112n extending in a direction of the blades 110a'-110h'. By comparison, for the blades 110a-110h shown in association with FIG. 14, the probes 112a-112h may extend perpendicular to the edges 200a-200h of the blades 110a-110h towards the outer radius of the outer conductor 102. In the embodiment 360, the probes 112a-112h may extend along the direction of the blades 110a'-110h' (and the edges 200a-200h) out the back of the broadband power circuit 100.

The probe 112a is shown extending from the blade 110a' out of the solid plate 282'. The coaxial connector 220a is shown attached to a back of the solid plate 282'. The probe 112a may be connected to the coaxial connector 220a. Similarly, the probe 112e is shown extending from the blade 110e' out of the solid plate 282'. The coaxial connector 220e is shown attached to a back of the solid plate 282'. The probe 112e may be connected to the coaxial connector 220a. Similarly, the other probes 112a-112h may each extend from a respective one of the blades 110a'-110h' out the back of the solid plate 282'.

The back view 366 may provide a head on view of the back of the solid plate 282'. The solid plate 282' is shown having a circular shape, similar to the outer conductor 102 shown in the front view 362. The coaxial connectors 220a-220h are shown attached to the solid plate 282'. The back view 366 may show the coaxial connectors 220a-220h head on.

The coaxial connectors 220a-220h may be arranged in a circular pattern on the solid plate 282'. The coaxial connectors 220a-220h may be evenly spaced in the circular pattern. The coaxial connectors 220a-220h may be aligned with the blades 110a'-110h' that extend from the inner conductor 104. In the example shown, eight of the coaxial connectors 220a-220h may be implemented to correspond with the number of the blades 110a'-110h'. Since the coaxial connectors 220a-220h may be aligned with the blades 110a'-110h', the coaxial connectors 220a-220h may be connected to the respective probes 112a-112h extending through the solid plate 282'. The probes 112a-112h may be covered by the coaxial connectors 220a-220h in the view 366.

Referring to FIG. 17, a diagram illustrating an example embodiment with probes extending out from an inner conductor to a back end is shown. An example embodiment 380 is shown. The example embodiment 380 may be illustrated with a front view 382, a cross-section view 384 and a back view 386. The example embodiment 380 may have a similar configuration as the example embodiment 360 of the broadband power circuit 100 shown in association with FIG. 16, but with the coaxial connectors 220a-220o removed.

The front view 382 may comprise the outer conductor 102. The I/O probe 190 is shown extending from the front end 154 of the outer conductor 102. In some embodiments, the I/O probe 190 may be flush with the front end 154 and may be connected to the coaxial connector 2200. In some embodiments, the I/O probe 190 may extend beyond the front end 154 and may be connected to the coaxial connector 2200. A cross-section line A-A is shown down the middle of the outer conductor 102 in the front view 382. The cross-section line A-A may cross the middle of the I/O probe 190.

The cross-section view 384 may provide a side view of the outer conductor 102 and the inner conductor 104 from the perspective shown by the cross-section line A-A. A cross-section of the outer conductor 102, the inner conductor 104, the blade 110a', the blade 110e', the probe 112a, the probe 112e, the I/O probe 190 and the solid plate 282' is shown.

Similar to the cross-section view 364 shown in association with FIG. 16, the blades 110a'-110n' may extend from the inner conductor 104. The tapered end 180 of the inner conductor 104 may extend to the outer conductor 102 with the I/O probe 190 at the front end 154. The probes 112a-112h may be configured to extend from a back of a respective one of the blades 110a'-110h'. The probe 112a is shown extending from the blade 110a' out of the solid plate 282'. The probe 112e is shown extending from the blade 110e' out of the solid plate 282'. Similarly, the other probes 112a'-112h' may each extend from a respective one of the blades 110a'-110h' out the back of the solid plate 282'.

The back view 386 may provide a head on view of the back of the solid plate 282'. The probes 112a-112h are shown extending from the solid plate 282'. The back view 366 may show the probes 112a-112h head on.

The probes 112a-112h may be arranged in a circular pattern on the solid plate 282'. The probes 112a-112h may be evenly spaced in the circular pattern. The probes 112a-112h may be aligned with the blades 110a'-110h' that extend from the inner conductor 104. In the example shown, eight of the probes 112a-112h may be implemented to correspond with the number of the blades 110a'-110h'. In some embodiments, the probes 112a-112h may extend through the solid plate 282' to be flush with the solid plate 282' and each of the probes 112a-112h may be connected to one of the coaxial connectors 220a-220h. In some embodiments, the probes 112a-112h may extend through the solid plate 282' and extend beyond the solid plate 282' and each of the probes 112a-112h may be connected to a respective one of the coaxial connectors 220a-220h.

The probes 112a-112h extending through the back of the solid plate 282' may enable one type of architecture for a broadband power circuit 100. One broadband power circuit 100 may be implemented as a power splitter and another implementation of the broadband power circuit 100 may be implemented as a power combiner. The power splitter and power combiner may be implemented back-to-back with the amplifier circuits 52a-52n in between. Since the probes 112a-112h extend from the back of the solid plate 282', the amplifiers 52a-52n may be implemented behind the power splitter and the power combiner.

Figure 18:
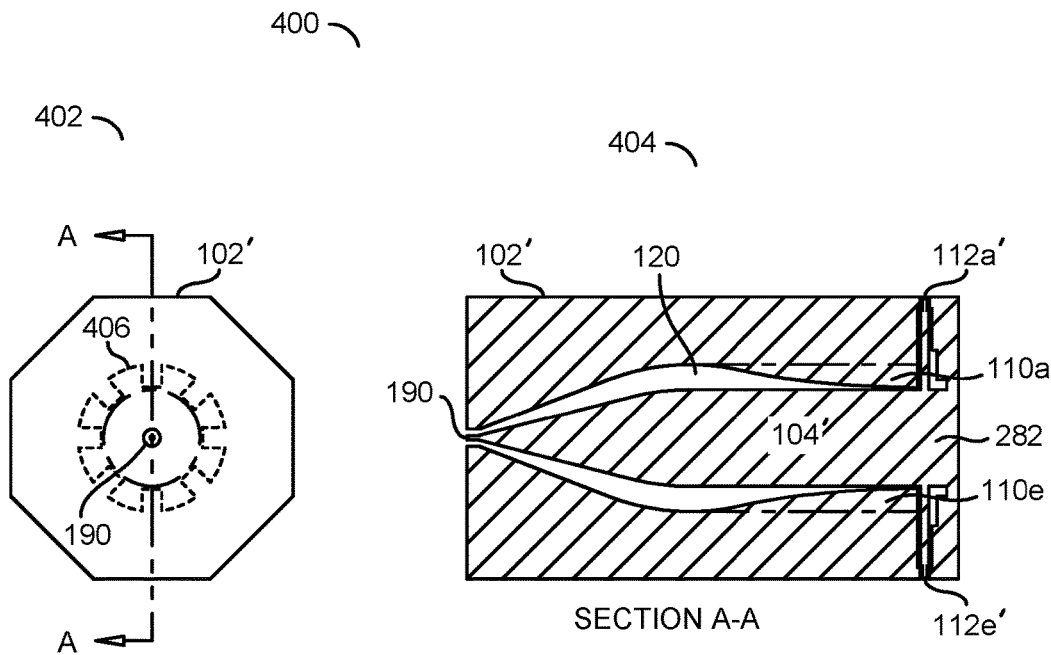
FIG. 18 is a diagram illustrating an example embodiment with the blades extending from an outer conductor.

Referring to FIG. 18, a diagram illustrating an example embodiment with the blades extending from an outer conductor is shown. An example embodiment 400 is shown. The example embodiment 400 may be illustrated with a front view 402 and a cross-section view 404. The example embodiment 400 may have a similar configuration as the example embodiment of the broadband power circuit 100 shown in association with FIG. 3 with the blades 110a-110n attached to inside surface of the outer conductor 102.

The front view 402 may comprise the outer conductor 102'. The outer conductor 102' may have a similar shape as the outer conductor 102 shown in association with FIG. 15. The outer conductor 102' is shown without any of the coaxial conductors 220a-220o. In the example shown, the probes 112a-112h are not shown extending from the outer conductor 102'. For example, the probes 112a-112h may extend flush with the outer conductor 102' (or the backplate 156 and the solid plate 282) and may be attached to the respective coaxial connectors 220a-220h. In some embodiments, the probes 112a-112h may extend beyond the outer conductor 102 (or the backplate 156 and the solid plate 282) and may be attached to the coaxial connectors 220a-220h. In some embodiments, the probes 112a-112h may extend behind the solid plate 282 instead of along the outer radius of the outer conductor 102'.

The I/O probe 190 is shown extending from the front end 154 of the outer conductor 102. In some embodiments, the I/O probe 190 may be flush with the front end 154 and may be connected to the coaxial connector 2200. In some embodiments, the I/O probe 190 may extend beyond the front end 154 and may be connected to the coaxial connector 2200.

A dotted shape 406 is shown. The dotted shape 406 may represent the blades 110a-110h extending down from the inside surface of the outer conductor 102' (instead of the blades 110a-110h extending out from the inner conductor 104 as shown in association with FIG. 13). A cross-section line A-A is shown down the middle of the outer conductor 102' in the front view 402. The cross-section line A-A may cross the middle of the I/O probe 190.

The cross-section view 404 may provide a side view of the outer conductor 102' and the inside conductor 104' from the perspective shown by the cross-section line A-A without the coaxial connectors 220a-220h attached. A cross-section of the outer conductor 102', the inner conductor 104', the blade 110a, the blade 110e, the probe 112a', the probe 112e', the I/O probe 190 and the solid plate 282 is shown.

In the embodiment 400, the blades 110a-110h may extend down from the inside surface of the outer conductor 102'. The blades 110a-110h may have a similar implementation and/or characteristics as the blades 110a-110h that extend from the inner conductor 104 as shown in association with FIG. 13. The cavity 120 may be in the empty space between the outer conductor 102' and the inner conductor 104'. The inner conductor 104' may be implemented with the tapered end 180 and the cylindrical portion 182-184. However, for the inner conductor 104' the cylindrical portion 182 may not be bladed (e.g., the blades 110a-110h may extend from the outer conductor 102' instead).

The probe 112a' is shown extending from the inner conductor 104'. The probe 112a' may extend out from the inner conductor 104' and through the blade 110a that extends down from the outer conductor 102'. The probe 112a' may extend from the inner conductor 104' and through the outer conductor 102'. The probe 112a' may extend through to the outer radius of the outer conductor 102' (or the backplate 156 and the solid plate 282). Similarly, the probe 112e' is shown extending from the inner conductor 104'. The probe 112e' may extend out from the inner conductor 104' and through the blade 110e that extends down from the outer conductor 102'. The probe 112e' may extend from the inner conductor 104' and through the outer conductor 102'. The probe 112e' may extend through to the outer radius of the outer conductor 102' (or the backplate 156 and the solid plate 282). The other probes 112a'-112h' may similarly extend out from the inner conductor 104'.

In the embodiment shown, the blades 110a-110h may extend down from the inside surface of the outer conductor 102' with the probes 112a'-112h' extending out of the outer radius of the outer conductor 102'. In some embodiments, the blades 110a'-110h' may extend from the inside surface of the outer conductor 102'. When the blades 110a'-110h' are implemented, the probes 112a'-112h' may be configured to extend from the inner conductor 104' out the back of the solid plate 282' (similar to the implementation shown in association with FIGS. 16-17).

Figure 19:
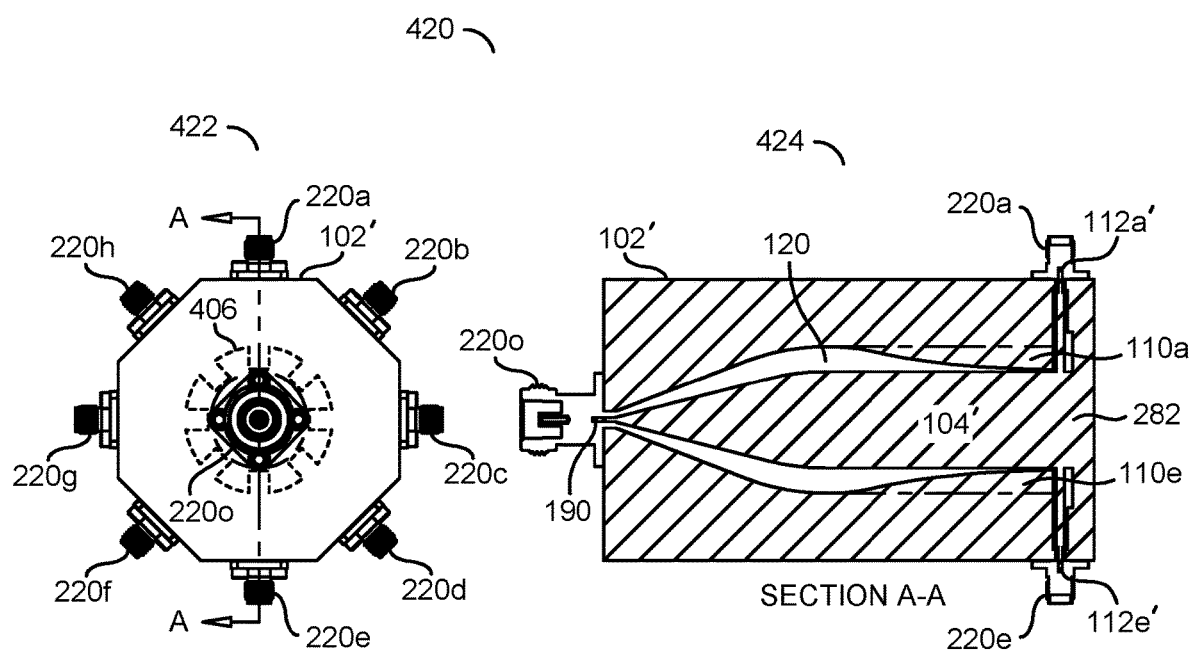
FIG. 19 is a diagram illustrating an example embodiment with the blades extending from an outer conductor and the probes extending from an inner conductor to coaxial connectors on an outer radius of the inner conductor.

Referring to FIG. 19, a diagram illustrating an example embodiment with the blades extending from an outer conductor and the probes extending from an inner conductor to coaxial connectors on an outer radius of the inner conductor is shown. An example embodiment 420 is shown. The example embodiment 420 may be illustrated with a front view 422 and a cross-section view 424. The example embodiment 420 may have a similar configuration as the example embodiment 400 of the broadband power circuit 100 shown in association with FIG. 18, but with the coaxial connectors 220a-220o attached.

The coaxial connectors 220a-220h are shown attached to the outer conductor 102'. In the example shown, the broadband power circuit 100 may be implemented with eight of the probes 112a'-112h'. The coaxial connectors 220a-220h may be arranged around an outer radius of the outer conductor 102'. For example, the coaxial connectors 220a-220h may be evenly spaced in a generally circular arrangement around the outside of the outer conductor 102'. While the coaxial connectors 220a-220h are shown attached the outer conductor 102', the coaxial connectors 220a-220h may be attached to the backplate 156 and the solid plate 282, which is attached to the first outer portion 150 of the outer conductor 102'.

The front view 422 may comprise the coaxial connector 220o. The coaxial connector 220o may be attached to the front end 154 of the outer conductor 102'. The coaxial connector 220o may be visible when viewing the broadband power circuit 100 head on. A cross-section line A-A is shown down the middle of the outer conductor 102' in the front view 422. The cross-section line A-A may cross the middle of the coaxial connector 220a, the coaxial connector 220o and the coaxial connector 220e.

The cross-section view 424 may provide a side view of the outer conductor 102' and the inner conductor 104' from the perspective shown by the cross-section line A-A. A cross-section of the outer conductor 102', the inner conductor 104', the blade 110a, the blade 110e, the probe 112a', the probe 112e', the I/O probe 190, the coaxial connector 220a, the coaxial connector 220e, the coaxial connector 220o and the solid plate 282 is shown.

The blades 110a-110n may extend down from the outer conductor 102'. The tapered end 180 of the inner conductor 104' may extend to the outer conductor 102' with the I/O probe 190 at the front end 154. The probe 112a' may extend from the inner conductor 104' (e.g., and through the blade 110a of the outer conductor 102') to the outer radius of the outer conductor 102' near the solid plate 282. The probe 112e' may extend from the inner conductor 104' (e.g., and through the blade 110e of the outer conductor 102') to the outer radius outer conductor 102' near the solid plate 282. The I/O probe 190 may be connected to the coaxial connector 2200, the probe 112a' may be connected coaxial connector 220a and the probe 112e' may be connected to the coaxial connector 220e.

Figure 20:
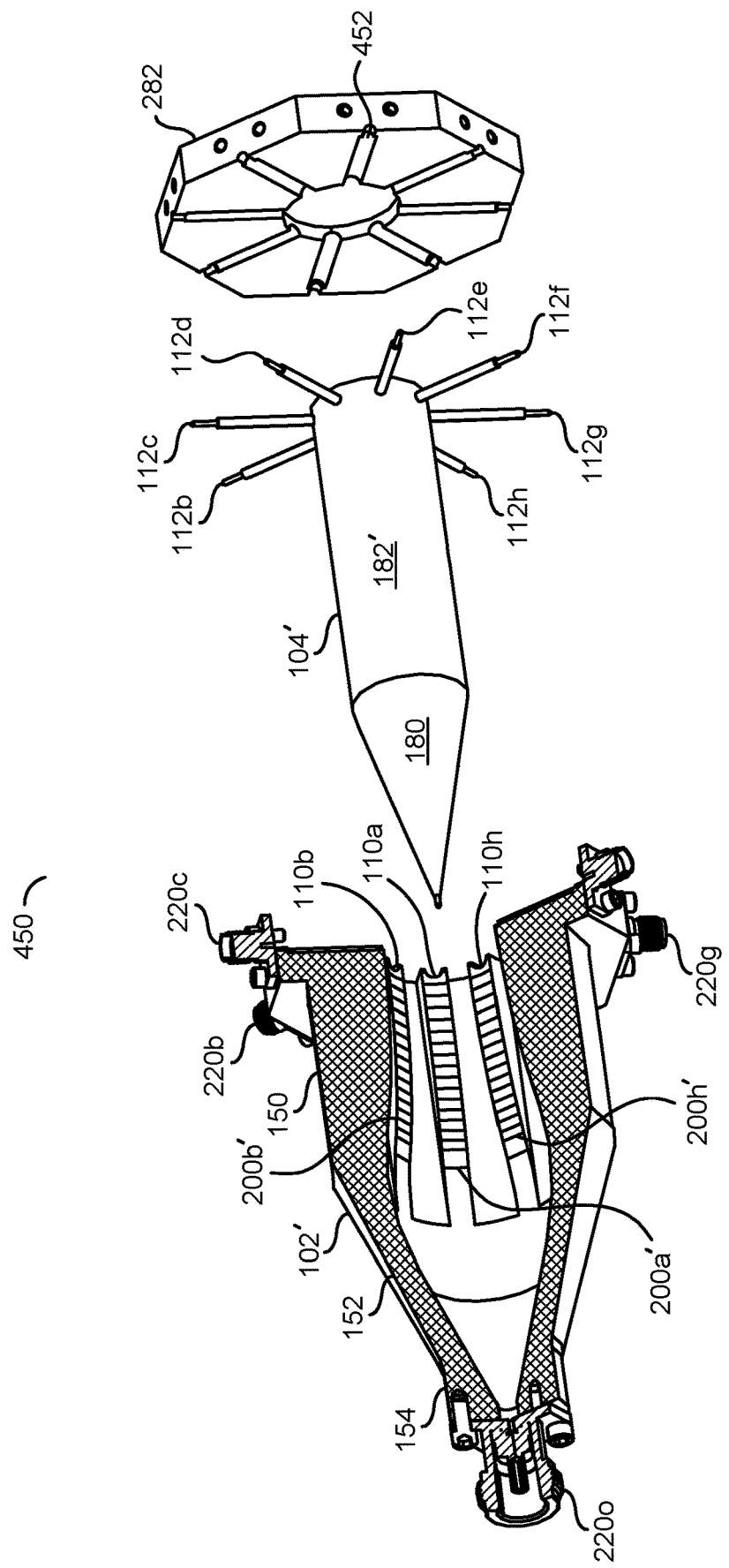
FIG. 20 is a diagram illustrating an exploded view of an example embodiment with the blades extending from an outer conductor.

Referring to FIG. 20, a diagram illustrating an exploded view of an example embodiment with the blades extending from an outer conductor is shown. An exploded view 450 is shown. The exploded view 450 may comprise a view of the broadband power circuit 100 with the blades 110a-110n extending from the inside surface of the outer conductor 102 with the various components separated for illustrative purposes. The exploded view 450 may comprise the outer conductor 102', the inner conductor 104' and the solid plate 282 shown separated from each other.

The exploded view 450 may illustrate a cutaway version of the outer conductor 102'. The cutaway version of the outer conductor 102' may provide a view of the outside and inside of the outer conductor 102'. The first outer portion 150, the second outer portion 152 and the front end 154 are shown on the outside of the outer conductor 102'. The coaxial connector 220b, the coaxial connector 220c and the coaxial connector 220g are shown around the outer radius of the outer conductor 102'. The coaxial connector 220o is shown attached to the front end 154. The first outer portion 150, the second outer portion 152, the front end 154 and/or the coaxial connectors 220a-220o of the outer conductor 102' may have a similar appearance and functionality as the corresponding components in broadband power circuit 100 in the cutaway view 300 shown in association with FIG. 13.

The blade 110a, the blade 110b and the blade 110h are shown on an inner portion of the outer conductor 102'. The blade 110a, the blade 110b and the bladed 110h may extend from the inside surface of the outer conductor 102'. The blades 110a-110n may extend towards a center of the inner conductor 104'. The edge 200a' of the blade 110a is shown. The edge 200h' of the blade 110h is shown. For embodiments, with the blades 110a-110n extending from the inside surface of the outer conductor 102', the edges 200a'-200n' may face towards a center of the cavity 120 (e.g., compared to the edges 200a-200n that face towards the inside surface of the outer conductor 102 when the blades 110a-110n extend from the inner conductor 104). The blades 110a-110n may extend along the inner surface 170 (e.g., the inside surface that corresponds to the first outer portion 150). The blades 110a-110n may have a longest distance of extension (e.g., tallest) near the solid plate 282 (e.g., the back end of the broadband power circuit 100). The blades 110a-110n may gradually taper down towards the inside surface of the outer conductor 102' until the edges 200a'-200n' meet the inside surface of the outer conductor 102' (e.g., gradually extend a shorter distance from the inside surface of the outer conductor 102' along a length of the blades 110a-110n). The blades 110a-110n may taper down (e.g., extend a shorter distance) as the blades 110a-110n approach the inner surface 172 (e.g., the portion of the inside surface that corresponds with the second outer portion 152).

The exploded view 450 may illustrate the inner conductor 104'. The inner conductor 104' may be implemented without the blades 110a-110n. The inner conductor 104' may comprise the tapered end 180 and the cylindrical portion 182'. The tapered end 180 may gradually form a point from the cylindrical portion 182' to the probe 190. The tapered end 180 of the inner conductor 104' may have a similar implementation as the tapered end 180 of the inner conductor 104 shown in association with FIG. 13.

The cylindrical portion 182' may be a smooth cylinder without the blades 110a-110n. The probes 112a-112h are shown extending from the inner conductor 104'. The probes 112a-112h may be evenly spaced around the radius of the inner conductor 104'. In the example shown, the cylindrical portion 182' may comprise eight of the probes 112a-112n. The number of probes 112a-112n extending from the cylindrical portion 182' may be varied according to the design criteria of a particular implementation.

The probes 112a-112h may extend from the inner conductor 104' outwards towards the blades 110a-110n. Each of the probes 112a-112n may pass through a respective one of the blades 110a-110n. The probes 112a-112n may extend through the outer conductor 102. Each of the probes 112a-112n may be connected to a respective one of the coaxial connectors 220a-220n around the outer surface of the outer conductor 102'.

The exploded view 450 may illustrate the solid plate 282. The solid plate 282 may fit against a back end of the inner conductor 104' and seal the outer conductor 102'. An impression 452 is shown on the solid plate 282. The impression 452 may have a shape that corresponds to the shape and arrangement of the probes 112a-112n. For example, the impression 452 may be configured to align with the probe openings 168a-168n shown in association with FIG. 6. When the solid plate 282 is fit against the back end of the inner conductor 104', the probes 112a-112n and the inner conductor 104' may fit within the impression 452 and the probe openings 168a-168n. The impression 452 may be configured to hold the inner conductor 104' and the probes 112a-112n in place when the broadband power conductor 100 is sealed. The impression 452 may be configured to align the probes 112a-112n with the blades 110a-110n and the coaxial connectors 220a-220n.

Figure 21:
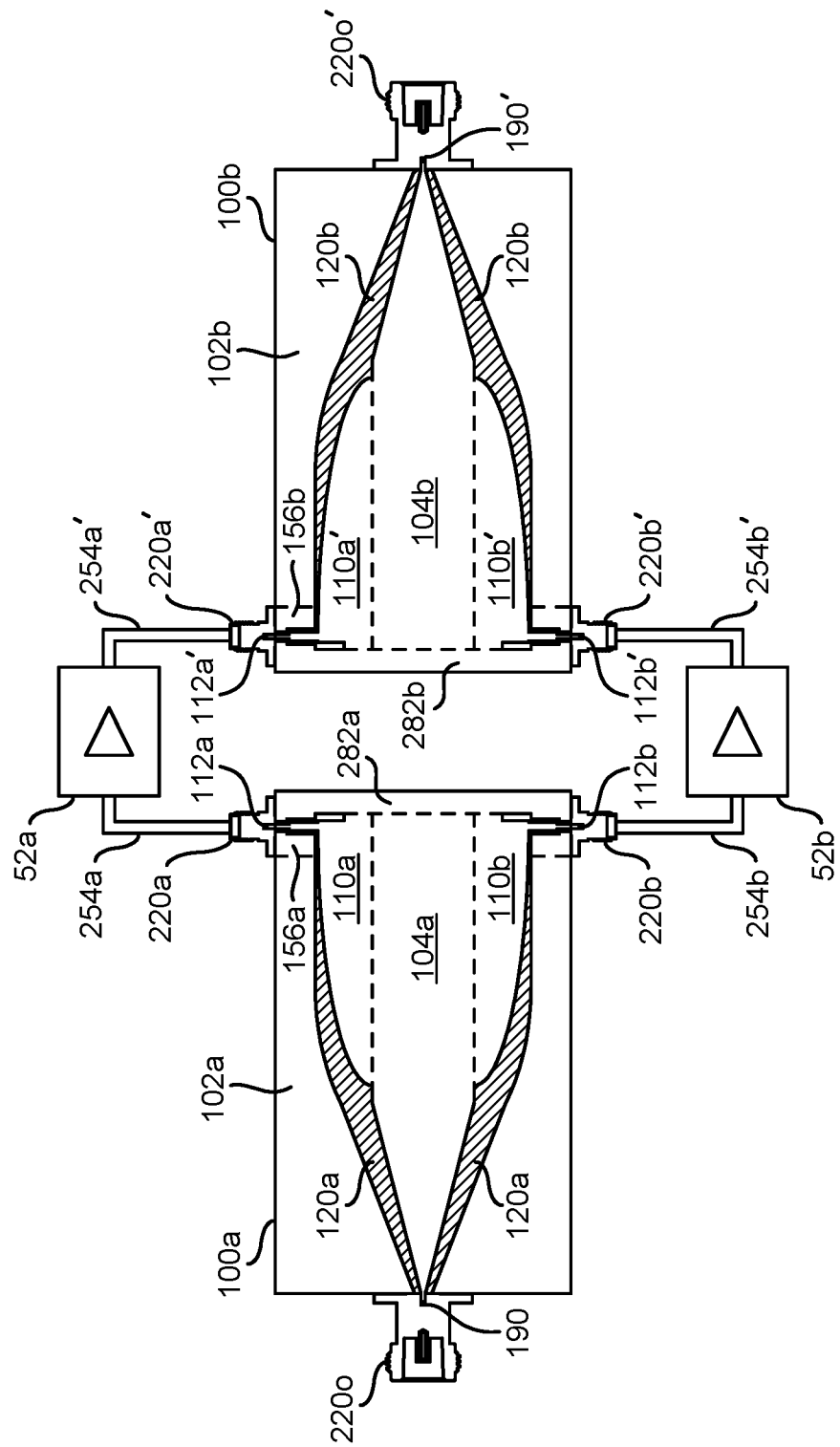
FIG. 21 is a diagram illustrating an example architecture of a power splitter and power combiner.

Referring to FIG. 21, a diagram illustrating an example architecture of a power splitter and power combiner is shown. An architecture 480 is shown. The architecture 480 may comprise two broadband power circuits 100a-100b. The architecture 480 may comprise one implementation of the broadband power circuit 100 implemented as the broadband power splitter 100a and another implementation of the broadband power circuit 100 implemented as the broadband power combiner 100b. The architecture 480 may implement the broadband power circuits 100a-100b in a back-to-back arrangement. The back-to-back arrangement of the broadband power circuits 100a-100b may enable the architecture 480 to implement a broadband amplifier power circuit. In the example shown, the broadband power splitter 100a and the broadband power combiner 100b may have an implementation similar to the broadband power circuit 100 shown in association with FIG. 14. In another example, the broadband power splitter 100a and the broadband power combiner 100b may have an implementation similar to the broadband power circuit 100 shown in association with FIG. 19.

The broadband power splitter 100a may comprise the outer conductor 102a, the inner conductor 104a, the cavity 120a, the backplate 156a and the solid plate 282a. The blades 110a-110b are shown as illustrative examples of the blades 110a-110n of the broadband power splitter 100a. The blades 110a-110b are shown comprising respective probes 112a-112b and may have the edges 200a-200b with the predetermined shape that gradually meets with the inner conductor 104a. The probes 112a-112b may be connected to the respective coaxial cables 254a-254b. The I/O probe 190 is shown extending from an end of the inner conductor 104a.

The coaxial connector 220o is shown connected to the outer conductor 102a. The coaxial connector 220o may enable the broadband power splitter 100a to receive the signal I/O at the I/O probe 190a. For the broadband power splitter 100a, the signal I/O may be an input signal.

The broadband power combiner 100b may comprise the outer conductor 102b, the inner conductor 104b, the cavity 120b, the backplate 156b and the solid plate 282b. The blades 110a'-110b' are shown as illustrative examples of the blades 110a-110n of the broadband power combiner 100b. The blades 110a'-110b' are shown comprising respective probes 112a'-112b' and may have the edges 200a-200b with the predetermined shape that gradually meets with the inner conductor 104b. The probes 112a'-112b' may be connected to the respective coaxial cables 254a'-254b'. The I/O probe 190' is shown extending from an end of the inner conductor 104b.

The coaxial connector 2200' is shown connected to the outer conductor 102b. The coaxial connector 2200' may enable the broadband power combiner 100b to send the signal I/O from the I/O probe 190'. For the broadband power combiner 100b, the signal I/O may be an output signal.

The coaxial cables 254a-254b are shown connected to the respective coaxial connectors 220a-220b of the broadband power splitter 100a. The probes 112a-112b are shown connected to the respective coaxial connectors 220a-220b. The coaxial cables 254a'-254b' are shown connected to the respective coaxial connectors 220a'-220b' of the broadband power combiner 100b. The probes 112a'-112b' are shown connected to the respective coaxial connectors 220a'-220b'. In the example shown, the coaxial cables 254a-254b and/or the coaxial cables 254a'-254b' may be illustrated as jumper cables for illustrative purposes. In some embodiments, the coaxial cables 254a-254b and/or the coaxial cables 254a'-254b' may implement small amplifier sub-assemblies. The coaxial cables 254a-254b and/or the coaxial cables 254a'-254b' may connect to an interface of the amplifier circuits 52a-52b. Two amplifier circuits 52a-52b are shown for illustrative purposes. Generally, multiple of the amplifier circuits 52a-52n may be implemented around the outside circumference of the architecture 480. In an example, where the inner conductor 104a implements eight of the blades 110a-110h (and the inner conductor 104b implements eight of the blades 110a'-110h'), eight of the amplifier circuits 52a-52h may be implemented.

The amplifier circuit 52a-52n may be arranged around the outside of the broadband power circuits 100a-100b. In an example, the amplifiers circuits 52a-52n may be arranged radially around the back-to-back architecture 480 at a location where the solid plate 282a of the broadband power splitter 100a is against the solid plate 282b of the broadband power combiner 100b. The amplifier circuits 52a-52n may electrically connect the probes 112a-112n of the broadband power splitter 100a with the probes 112a'-112n' of the broadband power combiner 100b.

In the example shown, there may be a space between the solid plate 282a of the broadband power splitter 100a and the solid plate 282b of the broadband power combiner 100b. For example, the broadband power splitter 100a may be implemented at a distance from the broadband power combiner 100b. In some embodiments, the solid plate 282a of the broadband splitter 100a may be directly against the solid plate 282b of the broadband power combiner 100b. For example, the broadband power splitter 100a may be implemented touching the broadband power combiner 100b.

Implementing the amplifier circuits 52a-52n around the outside of the architecture 480 may enable physical access to the amplifier circuits 52a-52n. The physical access to the amplifier circuits 52a-52n may enable an operator to replace one or more of the amplifier circuits 52a-52n without opening either the broadband power splitter 100a or the broadband power combiner 100b (e.g., opening a broadband power circuit to replace an MMIC may result in a return to factory for repair, which may be avoided with the architecture 480). In an example, if the amplifier circuit 52i is malfunctioning, the operator may disconnect the amplifier circuit 52i and insert a replacement without disconnecting the other amplifier circuits and/or without removing the inner conductor 104a or the inner conductor 104b. The physical access enabled by the arrangement of the amplifier circuits 52a-52n around the architecture 480 may prevent prolonged operational downtime.

The broadband power circuits 100a-100b may enable the amplifier circuits 52a-52n to be implemented without a printed circuit board. The inner conductors 104a-104b may be implemented inside the respective outer conductors 102a-102b and the amplifier circuits 52a-52n may be on the outside. For example, there may not be individual amplifier components within the broadband power circuits 100a-100b that slide out. The architecture 480 may be implemented as one entire assembly. Implementing the architecture 480 as one entire assembly may enable the amplifier circuits 52a-52n to be tested and characterized individually before being integrated into the structure of the combiner/splitter architecture 480. Implementing the architecture 480 as one entire assembly may further increase performance by ensuring any build-to-build variations in the amplifier circuits 52a-52n are measured and noted so that the amplifier circuits 52a-52n that provide similar performance may be grouped together.

Implementing the amplifier circuits 52a-52n around the outside of the architecture 480 may enable forced air for heat-sinking for the amplifier circuits 52a-52n. The arrangement of the amplifier circuits 52a-52n around the outside of architecture 480 may provide physical space between the broadband power circuits 100a-100b and the amplifier circuits 52a-52n. The physical space may enable active cooling (e.g., fans) to force air across the amplifier circuits 52a-52n. The forced air provided across the amplifier circuits 52a-52n may provide cooling during the operation of the amplifier circuits 52a-52n. Sufficient cooling may prolong the lifespan of the amplifier circuits 52a-52n and/or ensure that the amplifier circuits 52a-52n prevent operating conditions (e.g., high heat) that may disrupt the performance stability of the amplifier circuits 52a-52n. Without the arrangement of the amplifier circuits 52a-52n provided by the architecture 480, the amplifier circuits 52a-52n may be implemented in an enclosed space, which may accumulate excessive heat.

The connector 2200 of the broadband power splitter 100a may receive an input signal (e.g., the input signal I/O). For example, the connector 220o may be connected to a coaxial cable that provides a connection to an external input device. The input signal I/O may be received by the input probe 190 of the inner conductor 104a. The electromagnetically symmetrical arrangement of the blades 110a-110n may be configured to split the input signal I/O into a number of component signals (e.g., the signals MW_A-MW_N). The component signals MW_A-MW_N may be transmitted from the inner conductor 104a via the respective probes 112a-112n. The probes 112a-112n connected to the coaxial connectors 220a-220n may transmit the component signals MW_A-MW_N to the interface 254a-254n of the respective amplifier circuits 52a-52n.

The broadband amplifier circuits 52a-52n may receive the component signals MW_A-MW_N from the broadband power splitter 100a via the interface 254a-254n. The broadband amplifier circuits 52a-52n may be configured to perform an amplification of the respective component signals MW_A-MW_N. The broadband amplifier circuits 52a-52n may be configured to generate the amplified component signals C_A-C_N in response to the component signals MW_A-MW_N. The broadband amplifier circuits 52a-52n may communicate the amplified component signals C_A-C_N to the broadband power combiner 100b. The amplified component signals C_A-C_N may be transmitted via the interface 254a'-254n'.

The probes 112a'-112n' of the broadband power combiner 100b connected to the coaxial connectors 220a'-220n' may receive the amplified component signals C_A-C_N from the interface 254a'-254n'. The amplified component signals C_A-C_N may be transmitted from the broadband amplifiers 52a-52n to the inner conductor 104b via the respective probes 112a'-112n'. The electromagnetically symmetrical arrangement of the blades 110a'-110n' of the inner conductor 104b may be configured to combine the amplified component signals C_A-C_N into an output signal (e.g., the output signal I/O). The output signal I/O may be received by the output probe 190' of the inner conductor 104b. The connector 2200 of the broadband power combiner 100b may provide the output signal I/O. For example, the connector 220o may be connected to a coaxial cable that provides a connection to an external output device.

The architecture 480 may be configured to amplify all of the component signals MW_A-MW_N separately to generate the amplified component signals C_A-C_N. The amplified component signals C_A-C_N may be combined into the output signal I/O by the broadband power combiner 100b. In an example, an external output device may use a 100 W signal at 2 GHz to 20 GHz and each of the amplifier circuits 52a-52n may provide a 10 W amplification. The architecture 480 may implement 10 of the amplifier circuits 52a-52n. The architecture 480 may combine the amplification performed by each of the amplifier circuits 52a-52n with low losses.

Figure 22:
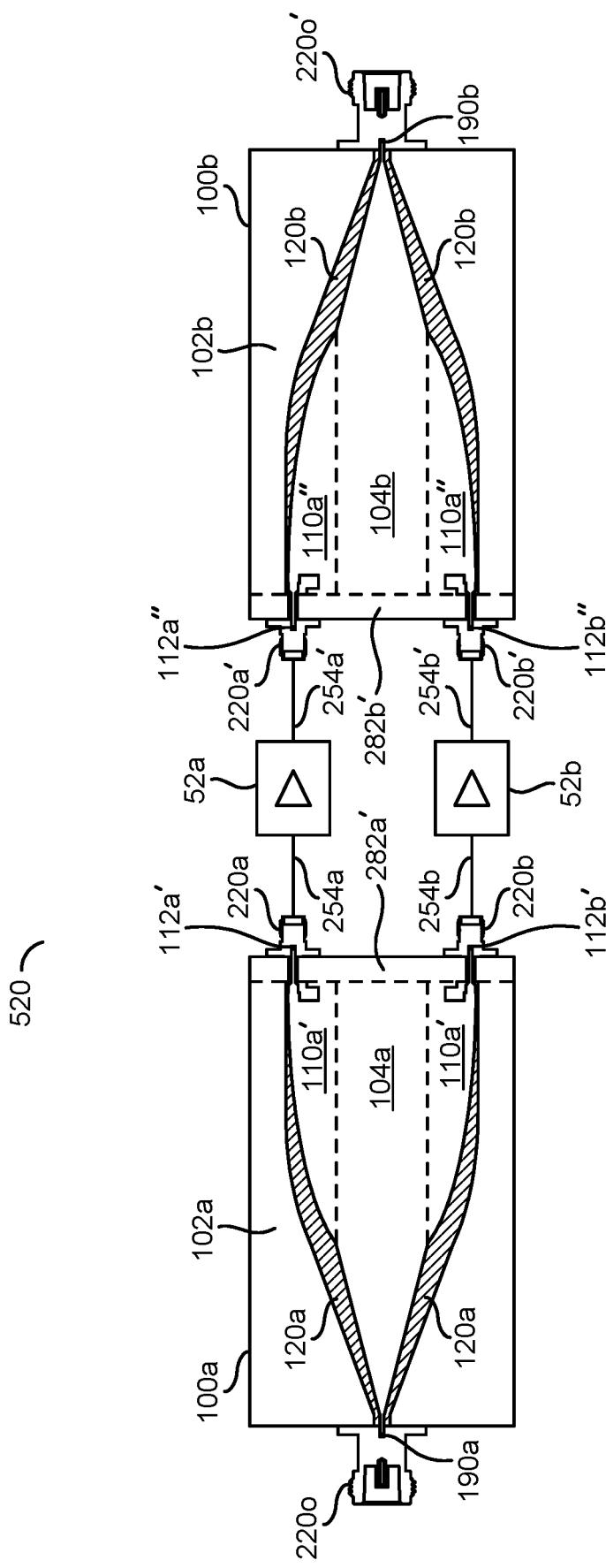
FIG. 22 is a diagram illustrating an alternate example architecture of a power splitter and power combiner.

Referring to FIG. 22, a diagram illustrating an alternate example architecture of a power splitter and power combiner is shown. An architecture 520 is shown. The architecture 520 may comprise two broadband power circuits 100a-100b. The architecture 520 may comprise one implementation of the broadband power circuit 100 implemented as the broadband power splitter 100a and another implementation of the broadband power circuit 100 implemented as the broadband power combiner 100b. The architecture 520 may implement the broadband power circuits 100a-100b in a back-to-back arrangement. The back-to-back arrangement of the broadband power circuits 100a-100b may enable the architecture 520 to implement a broadband amplifier power circuit. In an example, the broadband power splitter 100a and the broadband power combiner 100b may have an implementation similar to the broadband power circuit 100 shown in association with FIG. 16.

The broadband power splitter 100a may comprise the outer conductor 102a, the inner conductor 104a, the cavity 120a and the solid plate 282a'. The blades 110a'-110b' are shown as illustrative examples of the blades 110a'-110n' of the broadband power splitter 100a. The blades 110a'-110b' are shown comprising respective probes 112a'-112b' and may have the edges 200a-200b with the predetermined shape that gradually meets with the inner conductor 104a. The probes 112a'-112b' may be connected to the respective coaxial cables 254a-254b. The I/O probe 190a is shown extending from an end of the inner conductor 104a.

The coaxial connector 220o is shown connected to the outer conductor 102a. The coaxial connector 220o may enable the broadband power splitter 100a to receive the signal I/O at the I/O probe 190a. For the broadband power splitter 100a, the signal I/O may be an input signal.

The broadband power combiner 100b may comprise the outer conductor 102b, the inner conductor 104b, the cavity 120b and the solid plate 282b'. The blades 110a"-110b" are shown as illustrative examples of the blades 110a"-110n" of the broadband power combiner 100b. The blades 110a"-110b" are shown comprising respective probes 112a"-112b" and may have the edges 200a-200b with the predetermined shape that gradually meets with the inner conductor 104b. The probes 112a"-112b" may be connected to the respective coaxial cables 254a'-254b'. The I/O probe 190' is shown extending from an end of the inner conductor 104b.

The coaxial connector 220O' is shown connected to the outer conductor 102b. The coaxial connector 220O' may enable the broadband power combiner 100b to send the signal I/O from the I/O probe 190b. For the broadband power combiner 100b, the signal I/O may be an output signal.

The coaxial cables 254a-254b are shown connected to the respective coaxial connectors 220a-220b of the broadband power splitter 100a. The probes 112a'-112b' are shown connected to the respective coaxial connectors 220a-220b. The coaxial cables 254a'-254b' are shown connected to the respective coaxial connectors 220a'-220b' of the broadband power combiner 100b. The probes 112a"-112b" are shown connected to the respective coaxial connectors 220a'-220b'. In the example shown, the coaxial cables 254a-254b and/or the coaxial cables 254a'-254b' may be illustrated as jumper cables for illustrative purposes. In some embodiments, the coaxial cables 254a-254b and/or the coaxial cables 254a'-254b' may implement small amplifier sub-assemblies.

The probes 112a'-112b' may extend from the back of the broadband power splitter 100a. The probes 112a"-112b" may extend from the back of the broadband power combiner 100b. For example, with the back-to-back architecture 520, the probes 112a'-112b' may extend towards the probes 112a"-112b". The coaxial cables 254a-254b and/or the coaxial cables 254a'-254b' may connect to an interface of the amplifier circuits 52a-52b. Two amplifier circuits 52a-52b are shown for illustrative purposes. Generally, multiple of the amplifier circuits 52a-52n may be implemented in the space in between the broadband power splitter 100a and the broadband power combiner 100b. In an example, where the inner conductor 104a implements eight of the blades 110a-110h (and the inner conductor 104b implements eight of the blades 110a'-110h'), eight of the amplifier circuits 52a-52h may be implemented.

The amplifier circuit 52a-52n may be arranged in a circular pattern in between the broadband power circuits 100a-100b. In an example, the amplifiers circuits 52a-52n may be arranged in the circular pattern that corresponds to the circular pattern of the coaxial connectors 220a-220h on the solid plate 282' shown in association with FIG. 16. For example, the coaxial connectors 220a-220n (and the probes 112a'-112n') of the broadband power splitter 100a may be in the circular pattern on the solid plate 282a' and the coaxial connectors 220a'-220n' (and the probes 112a"-112n") may be directly across in the circular pattern on the solid plate 282b'. The coaxial cables 254a-254n may extend directly out behind the coaxial connectors 220a-220n to a respective one of the amplifier circuits 52a-52n, and the coaxial cables 254a'-254n' may extend directly out behind the coaxial connectors 220a'-220n' to a respective one of the amplifier circuits 52a-52n. The amplifier circuits 52a-52n may electrically connect the probes 112a'-112n' of the broadband power splitter 100a with the probes 112a"-112n" of the broadband power combiner 100b. In the example shown, there may be a space between the solid plate 282a' of the broadband power splitter 100a and the amplifiers 52a-52n and a space between the amplifiers 52a-52n and the solid plate 282b' of the broadband power combiner 100b.

Implementing the amplifier circuits 52a-52n in the space between the broadband power circuits 100a-100b of the architecture 520 may enable physical access to the amplifier circuits 52a-52n. The physical access to the amplifier circuits 52a-52n may enable an operator to replace one or more of the amplifier circuits 52a-52n without opening either the broadband power splitter 100a or the broadband power combiner 100b (e.g., opening a broadband power circuit to replace an MMIC may result in a return to factory for repair, which may be avoided with the architecture 520). In an example, if the amplifier circuit 52i is malfunctioning, the operator may disconnect the amplifier circuit 52i and insert a replacement without disconnecting the other amplifier circuits and/or without removing the inner conductor 104a or the inner conductor 104b. The physical access enabled by the arrangement of the amplifier circuits 52a-52n in between the broadband power circuits 100a-100b of the architecture 520 may prevent prolonged operational downtime.

The broadband power circuits 100a-100b may enable the amplifier circuits 52a-52n to be implemented without a printed circuit board. The inner conductors 104a-104b may be implemented inside the respective outer conductors 102a-102b and the amplifier circuits 52a-52n may be on the outside. For example, there may not be individual amplifier components within the broadband power circuits 100a-100b that slide out. The architecture 520 may be implemented as one entire assembly. Implementing the architecture 520 as one entire assembly may enable the amplifier circuits 52a-52n to be tested and characterized individually before being integrated into the structure of the combiner/splitter architecture 520. Implementing the architecture 520 as one entire assembly may further increase performance by ensuring any build-to-build variations in the amplifier circuits 52a-52n are measured and noted so that the amplifier circuits 52a-52n that provide similar performance may be grouped together.

Implementing the amplifier circuits 52a-52n in between the broadband power circuits 100a-100b of the architecture 520 may enable forced air for heat-sinking for the amplifier circuits 52a-52n. The arrangement of the amplifier circuits 52a-52n in between the broadband power circuits 100a-100b of architecture 520 may provide physical space between the broadband power circuits 100a-100b and the amplifier circuits 52a-52n. The physical space may enable active cooling (e.g., fans) to force air across the amplifier circuits 52a-52n. The forced air provided across the amplifier circuits 52a-52n may provide cooling during the operation of the amplifier circuits 52a-52n. Sufficient cooling may prolong the lifespan of the amplifier circuits 52a-52n and/or ensure that the amplifier circuits 52a-52n prevent operating conditions (e.g., high heat) that may disrupt the performance stability of the amplifier circuits 52a-52n. Without the arrangement of the amplifier circuits 52a-52n provided by the architecture 520, the amplifier circuits 52a-52n may be implemented in an enclosed space, which may accumulate excessive heat.

The communication of the various signals, the splitting of the various signals and the combination of the various signals between the broadband power splitter 100a, the amplifier circuits 52a-52n and the broadband power combiner 100b may be similar for the architecture 520 as described with respect to the architecture 480 shown in association with FIG. 21. For example, the communication of the input signal I/O, the component signals MW_A-MW_N, the amplified component signals C_A-C_N and the output signal I/O may be similar regardless of whether the amplifier circuits 52a-52n are arranged around an outer circumference of the broadband power splitter 100a and the broadband power combiner 100b (e.g., the architecture 480 of FIG. 21) or whether the amplifier circuits 52a-52n are arranged in the space between the broadband power splitter 100a and the broadband power combiner 100b (e.g., the architecture 520 of FIG. 22).

Figure 23:
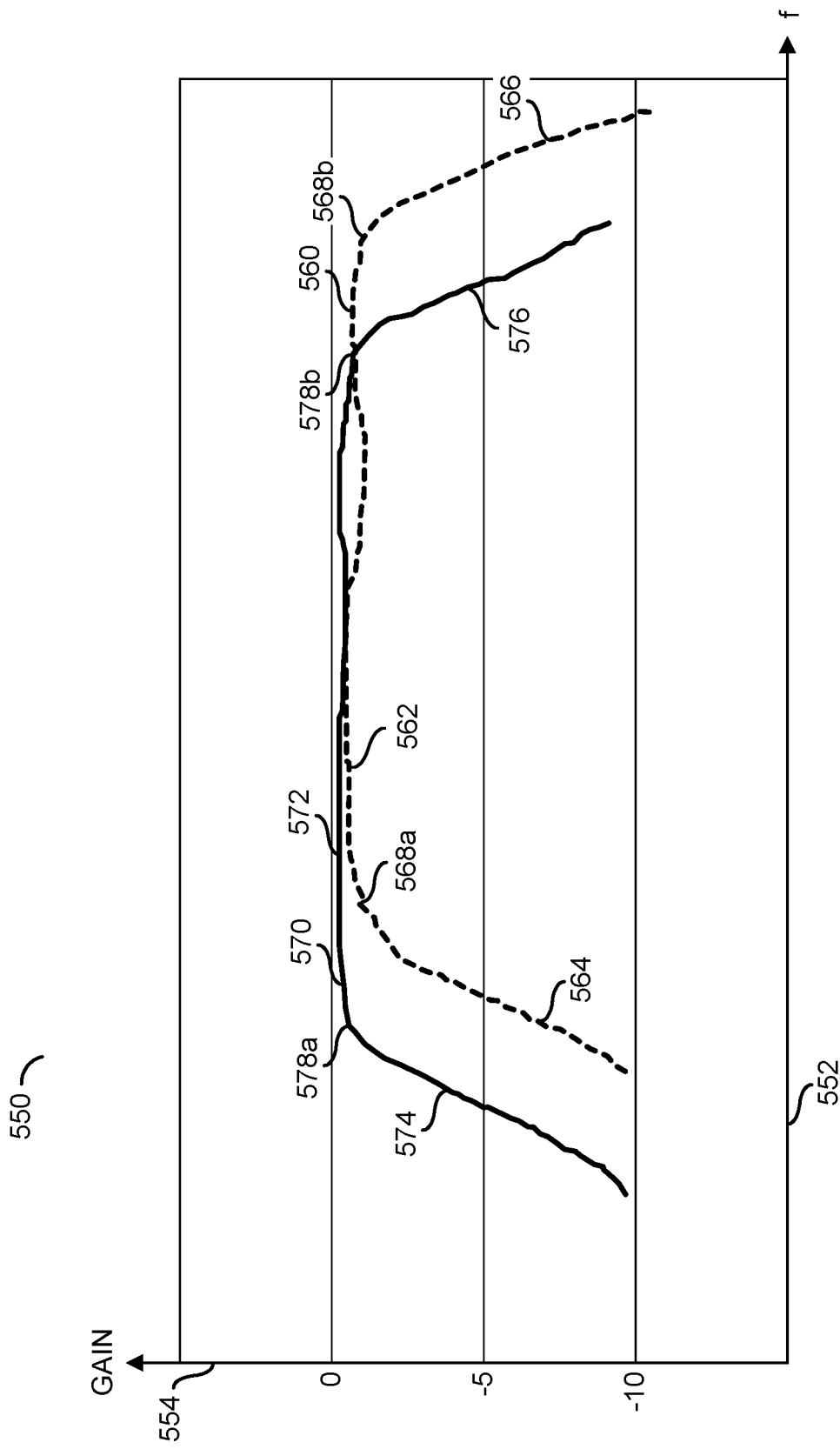
FIG. 23 is a diagram illustrating a frequency response graph for a large blade size and a small blade size for a broadband power circuit.

Referring to FIG. 23, a diagram illustrating a frequency response graph for a large blade size and a small blade size for a broadband power circuit. A graph 550 is shown. The graph 550 may illustrate the frequency response for the broadband power circuit 100.

The graph 550 may comprise an axis 552 and an axis 554. The axis 552 may be an x-axis for the graph 550. The x-axis 552 may represent frequency. In an example, the frequency of the x-axis 552 may be illustrated using a logarithmic scale. The axis 554 may be a y-axis for the graph 550. The y-axis 554 may represent a gain. In an example, the gain may be illustrated using a linear scale.

A line 560 is shown. The line 560 may represent a frequency response of the broadband power circuit 100 when the blades 110a-110n are implemented having a shorter blade size. The shorter blade frequency response 560 may comprise a region 562, a region 564 and a region 566. The region 562 may comprise the passband region for the shorter blade frequency response 560. The region 564 may comprise a low-end roll-off region for the shorter blade frequency response 560. The region 566 may comprise a high-end roll-off region for the shorter blade frequency response 560. Locations 568a-568b are shown. The locations 568a-568b may comprise cut-off frequencies. The cut-off frequency 568a may be a low-end cut-off frequency. The cut-off frequency 568b may be a high-end cut-off frequency.

A line 570 is shown. The line 570 may represent a frequency response of the broadband power circuit 100 when the blades 110a-110n are implemented having a longer blade size. The longer blade frequency response 570 may comprise a region 572, a region 574 and a region 576. The region 572 may comprise the passband region for the longer blade frequency response 570. The region 574 may comprise a low-end roll-off region for the longer blade frequency response 570. The region 576 may comprise a high-end roll-off region for the longer blade frequency response 570. Locations 578a-578b are shown. The locations 578a-578b may comprise cut-off frequencies. The cut-off frequency 578a may be a low-end cut-off frequency. The cut-off frequency 578b may be a high-end cut-off frequency.

The broadband power circuit 100 may have a total length of approximately 4.5 inches (e.g., from the solid plate 282 to the front end 154 of the outer conductor 102). The broadband power circuit 100 may have a diameter of approximately 2.5 inches (e.g., the diameter of the first outer portion 150 of the outer conductor 102).

The blades 110a-110n (e.g., regardless of whether implemented on the inner conductor 104 or the outer conductor 102) may have a length of approximately 2.5 inches. The length of the blades 110a-100n may be slightly shorter than the length of the cylindrical portion 182-184 of the inner conductor 104 and/or the length of the first outer portion 150 of the outer conductor 102. The blades 110a-100n may have a width of approximately 5 mm (e.g., the width of the edges 200a-200n). The height of the blades 110a-110n may be less than the radius of the broadband power circuit 100 (e.g., less than approximately 1.25 inches to account for the thickness of the outer conductor 102, the size of the inner conductor 104 and the space in the cavity 120).

The width and/or the size of the blades 110a-110n may be selected to enable a transfer of several 50 Ohm inputs (e.g., the signal I/O for the broadband power splitter 100a) to high impedance and then transfer the high impedance back to 50 Ohm (e.g., the single output I/O for the broadband power combiner 100b). The length of the blades 110a-110n may affect low end frequency. The width and depth of the blades 110a-110n may affect matching and/or a total usable bandwidth (e.g., the bandpass region 562 and the bandpass region 572) due to high order mode issues.

In the example shown, the shorter blade frequency response 560 may correspond to an implementation of the broadband power circuit 100 having the blades 110a-110n with a length of approximately 2.5 inches or less. The low-end cut-off frequency 568a may be at approximately 5 GHz. The high-end cut-off frequency 568b may be at approximately 25 GHz. In the example shown, the longer blade frequency response 570 may correspond to an implementation of the broadband power circuit 100 having the blades 110a-110n with a length of approximately 2.5 inches or greater. The low-end cut-off frequency 578a may be at approximately 2 GHz. The high-end cut-off frequency 568b may be at approximately 20 GHz.

For example, the broadband power circuit 100 implementing the blades 110a-110n with a shorter length may be operational at higher frequencies than the broadband power circuit 100 implementing the blades 110a-110n with a longer length. However, the broadband power circuit 100 implementing the blades 110a-110n with a longer length may be operational at lower frequencies than the broadband power circuit 100 implementing the blades 110a-110n with a shorter length. The length, width and/or height selected for the blades 110a-110n may be varied according to the design criteria of a particular implementation.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
a first broadband power circuit configured to (i) receive an input signal, (ii) split said input signal into a plurality of component signals and (iii) present each of said component signals to a respective one of a plurality of amplifiers; and
a second broadband power circuit configured to (i) receive a plurality of amplified component signals from said plurality of amplifiers, (ii) combine said plurality of amplified component signals into an output signal and (iii) present said output signal, wherein
(i) said first broadband power circuit and said second broadband power circuit each comprise (a) an outer conductor, (b) an inner conductor, (c) a cavity and (d) a plurality of blades,
(ii) each of said plurality of blades for both of said first broadband power circuit and said second broadband power circuit (a) are arranged evenly spaced along a surface within said cavity and (b) extend along a length of said surface with a predetermined shape,
(iii) said predetermined shape of each of said blades (a) has a probe at a first end and a second end of said predetermined shape gradually meets said surface and (b) is configured to provide a low-loss transition for propagation of a microwave signal,
(iv) said inner conductor is within said cavity inside of said outer conductor for both of said first broadband power circuit and said second broadband power circuit, and
(v) said output signal is an amplified version of said input signal.

2. The apparatus according to claim 1, wherein said plurality of amplifiers are (i) connected to an outside of said apparatus and (ii) configured to generate said plurality of amplified component signals in response to said plurality of component signals.

3. The apparatus according to claim 2, wherein (i) said probe of each of said blades is configured to extend out of said outer conductor around an outside circumference of said outer conductor for both said first broadband power circuit and said second broadband power circuit and (ii) said amplifiers (a) are arranged around said outside circumference of said outer conductor and (b) provide a connection between said first broadband power circuit and said second broadband power circuit.

4. The apparatus according to claim 2, wherein (i) said probe of each of said blades is configured to extend out of a back end for both said first broadband power circuit and said second broadband power circuit and (ii) said amplifiers (a) are arranged in between said first broadband power circuit and said second broadband power circuit and (b) provide a connection between said first broadband power circuit and said second broadband power circuit.

5. The apparatus according to claim 2, wherein connecting said plurality of amplifiers to said outside of said apparatus enables each of said plurality of amplifiers to be replaced individually without opening said apparatus.

6. The apparatus according to claim 2, wherein connecting said plurality of amplifiers to said outside of said apparatus enables each of said plurality of amplifiers to receive forced air for heat-sinking.

7. The apparatus according to claim 1, wherein (i) said first broadband power circuit implements a broadband power splitter and (ii) said second broadband power circuit implements a broadband power combiner.

8. The apparatus according to claim 1, wherein (i) a first direction of energy flow within said first broadband power circuit is from an input probe to said second end of said predetermined shape of each of said plurality of blades and to said probe at said first end of said predetermined shape of each of said plurality of blades and (ii) a second direction of energy flow within said second broadband power circuit is from said probe at said first end of said predetermined shape of each of said plurality of blades to said second end of said predetermined shape of each of said plurality of blades and to an output probe.

9. The apparatus according to claim 1, wherein said probe of each of said plurality of blades is connected to respective coaxial connector.

10. The apparatus according to claim 1, wherein (i) both said first broadband power circuit and said second broadband power circuit each further comprise a plurality of tuning structures and (ii) each of said plurality of tuning structures are implemented at a respective one of said second ends of said predetermined shape of said plurality of blades.

11. The apparatus according to claim 1, wherein a number of said plurality of blades implemented in said first broadband power circuit is equal to said number of said plurality of blades implemented in said second broadband power circuit.

12. The apparatus according to claim 11, wherein said number of said plurality of blades is eight.

13. The apparatus according to claim 1, wherein said apparatus is configured to implement broadband power combining and splitting in at least one octave of bandwidth.

14. The apparatus according to claim 13, wherein said at least one octave of bandwidth comprises a frequency range from 4 GHz to 8 GHz or 2 GHz to 20 GHz.

15. The apparatus according to claim 1, wherein said cavity provides an air gap between said inner conductor and said outer conductor.

16. The apparatus according to claim 1, wherein said low-loss transition is configured to reduce an amount of reflective loss and an amount of ohmic loss.

17. The apparatus according to claim 1, wherein said apparatus is configured to (i) transfer said input signal having a first impedance, (ii) split said input signal into said component signals with high impedance, (iii) enable said component signals to be amplified to said amplified component signals and (iv) combine said amplified component signals back to said first impedance as said output signal.

18. The apparatus according to claim 1, wherein for both said first broadband power circuit and said second broadband power circuit (i) said inner conductor comprises (a) a cylindrical portion, (b) a tapered end and (c) an I/O transition at said tapered end, (ii) said outer conductor comprises (a) a first coaxial connector and (b) a plurality of second coaxial connectors, (iii) said first coaxial connector is connected to said I/O transition of said tapered end and (iv) each of said plurality of second coaxial connectors is connected to said probe of one of said plurality of blades.

19. The apparatus according to claim 18, wherein for both said first broadband power circuit and said second broadband power circuit (i) said surface with said plurality of blades evenly spaced comprises said cylindrical portion of said inner conductor, (ii) each of said plurality of blades extend along a length of said cylindrical portion with said predetermined shape and (iii) said second end of said predetermined shape gradually meets said cylindrical portion a distance from said tapered end.

20. The apparatus according to claim 18, wherein for both said first broadband power circuit and said second broadband power circuit (i) said surface with said plurality of blades evenly spaced comprises an inside of said outer conductor, (ii) each of said plurality of blades extend along a length of said inside of said outer conductor with said predetermined shape, (iii) said second end of said predetermined shape gradually meets said inside of said outer conductor, (iv) said plurality of blades extend down into said cavity around said cylindrical portion of said inner conductor and (v) said probe of each of said plurality of blades is connected between said first end of said blades and said cylindrical portion of said inner conductor.

* * * * *